(12) United States Patent
Sonoda et al.

(10) Patent No.: US 8,907,445 B2
(45) Date of Patent: Dec. 9, 2014

(54) SUBSTRATE TO WHICH FILM IS FORMED, ORGANIC EL DISPLAY DEVICE, AND VAPOR DEPOSITION METHOD

(75) Inventors: Tohru Sonoda, Osaka (JP); Shinichi Kawato, Osaka (JP); Satoshi Inoue, Osaka (JP); Satoshi Hashimoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/980,563

(22) PCT Filed: Jan. 13, 2012

(86) PCT No.: PCT/JP2012/050616
§ 371 (c)(1),
(2), (4) Date: Jul. 18, 2013

(87) PCT Pub. No.: WO2012/099019
PCT Pub. Date: Jul. 26, 2012

(65) Prior Publication Data
US 2013/0299810 A1 Nov. 14, 2013

(30) Foreign Application Priority Data
Jan. 19, 2011 (JP) ................ 2011-009182

(51) Int. Cl.
*H01L 27/32* (2006.01)
*C23C 14/12* (2006.01)
*H05B 33/10* (2006.01)
*H01L 51/00* (2006.01)
*C23C 14/04* (2006.01)
*H01L 51/56* (2006.01)

(52) U.S. Cl.
CPC ............ *H01L 27/3262* (2013.01); *C23C 14/12* (2013.01); *H05B 33/10* (2013.01); *H01L 51/0011* (2013.01); *H01L 27/3211* (2013.01); *C23C 14/044* (2013.01); *H01L 51/56* (2013.01)
USPC ............ 257/526; 438/296; 438/478; 257/40; 257/618

(58) Field of Classification Search
USPC .......................................... 257/526; 438/296
See application file for complete search history.

(56) References Cited

U.S. PATENT DOCUMENTS 5,688,551 A 11/1997 Littman et al.
5,742,129 A 4/1998 Nagayama et al.
(Continued)

FOREIGN PATENT DOCUMENTS

JP H08-227276 A 9/1996
JP H09-167684 A 6/1997
JP H10-102237 A 4/1998
(Continued)

OTHER PUBLICATIONS

International Search Report mailed Mar. 6, 2012 for PCT/JP2012/050616, 2 pages English Translation and 2 pages ISR; total 4 pages.

*Primary Examiner* — Zandra Smith
*Assistant Examiner* — Lawrence Tynes, Jr.
(74) *Attorney, Agent, or Firm* — Morrison & Foerster LLP

(57) ABSTRACT

A film formation substrate (200) is a film formation substrate having a plurality of vapor deposition regions (24R and 24G) (i) which are arranged along a predetermined direction and (ii) in which respective vapor-deposited films (23R and 23G) are provided. The vapor-deposited film (24R) has inclined side surfaces 23s which are inclined with respect to a direction normal to the film formation substrate (200). A width, in the predetermined direction, of the vapor-deposited film (23R) is larger than the sum of (i) a width, in the predetermined direction, of the vapor deposition region (24R) and (ii) a width, in the predetermined direction, of a region (29) between the vapor deposition region (24R) and the vapor deposition region (24G).

13 Claims, 23 Drawing Sheets

(56) References Cited

U.S. PATENT DOCUMENTS

| | | |
|---|---|---|
| 5,937,272 A * | 8/1999 | Tang .............................. 438/30 |
| 6,294,892 B1 | 9/2001 | Utsugi et al. |
| 8,664,023 B2 * | 3/2014 | Sonoda et al. ................. 438/29 |
| 2003/0168013 A1 | 9/2003 | Freeman et al. |
| 2005/0174044 A1 | 8/2005 | Miura |
| 2005/0211172 A1 | 9/2005 | Freeman et al. |
| 2012/0183676 A1* | 7/2012 | Sonoda et al. .................... 427/8 |
| 2013/0199445 A1* | 8/2013 | Sonoda et al. ................ 118/712 |
| 2013/0285038 A1* | 10/2013 | Sonoda et al. .................. 257/40 |
| 2013/0292666 A1* | 11/2013 | Sonoda et al. .................. 257/40 |

FOREIGN PATENT DOCUMENTS

| | | |
|---|---|---|
| JP | 2000-188179 A | 7/2000 |
| JP | 2004-508927 A | 3/2004 |
| JP | 2005-222853 A | 8/2005 |
| JP | 2008-518094 A | 5/2008 |
| WO | WO-02/24321 A1 | 3/2002 |

* cited by examiner

SUBSTRATE SCANNING DIRECTION

F I G. 8
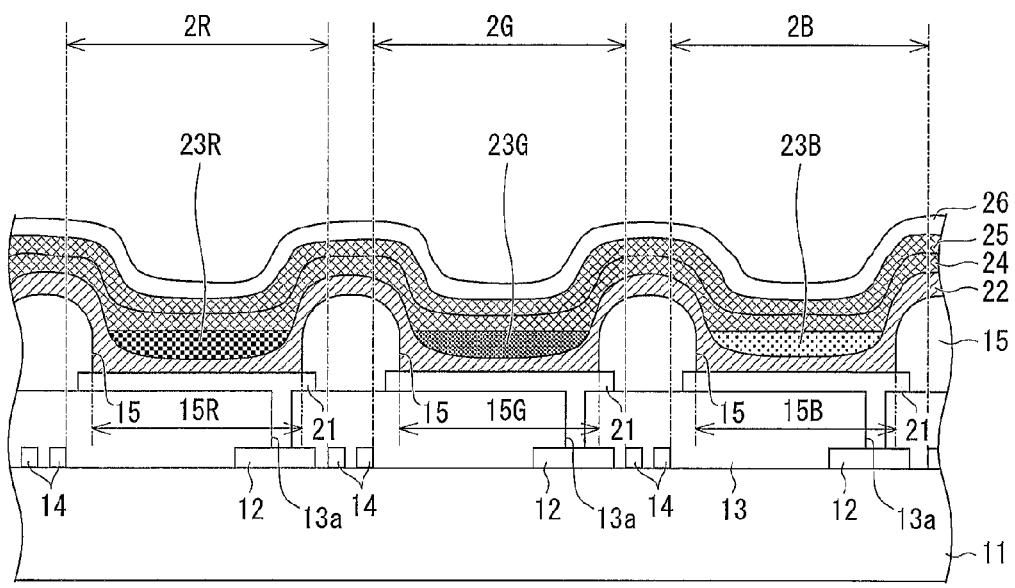

F I G. 1 0
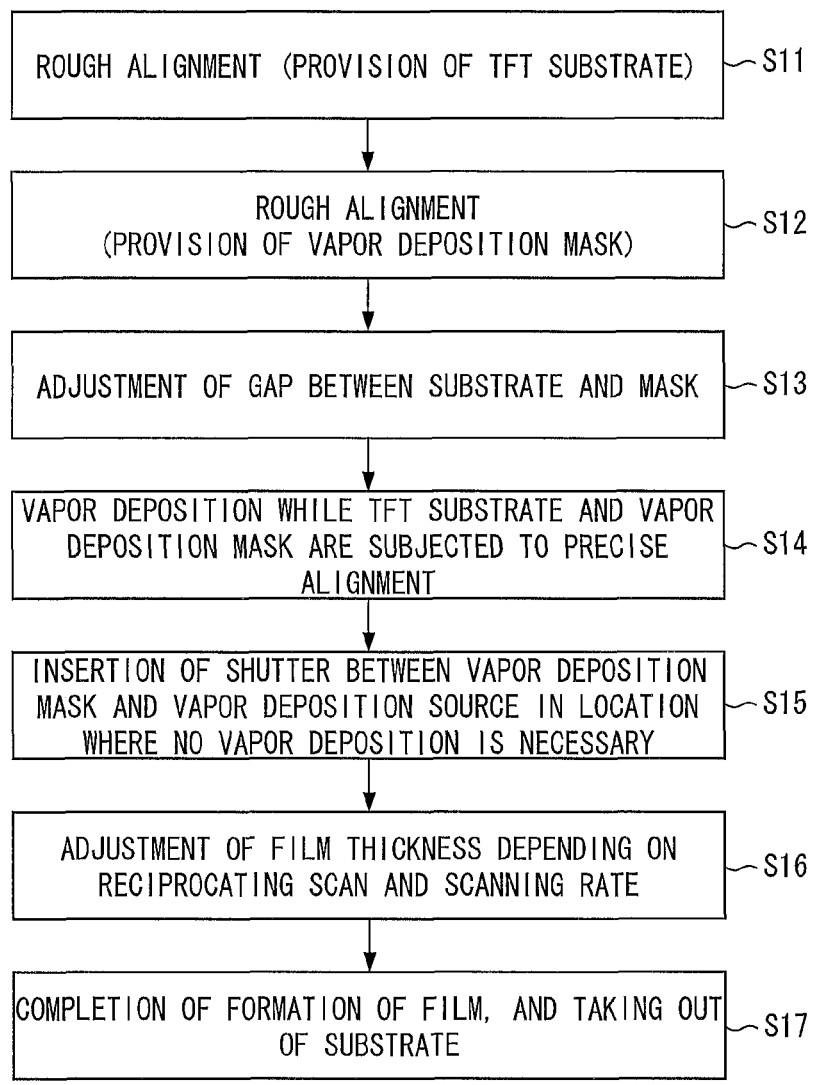

F I G. 1 1
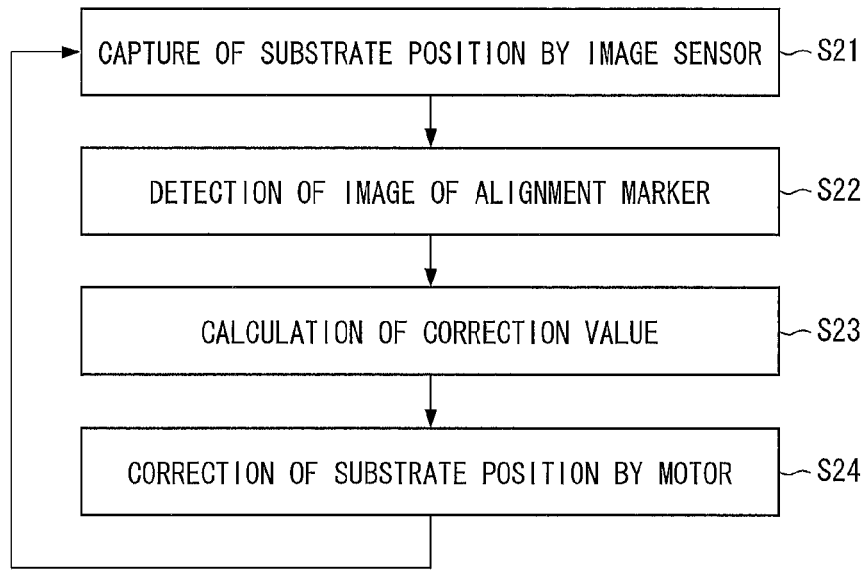
F I G. 1 2
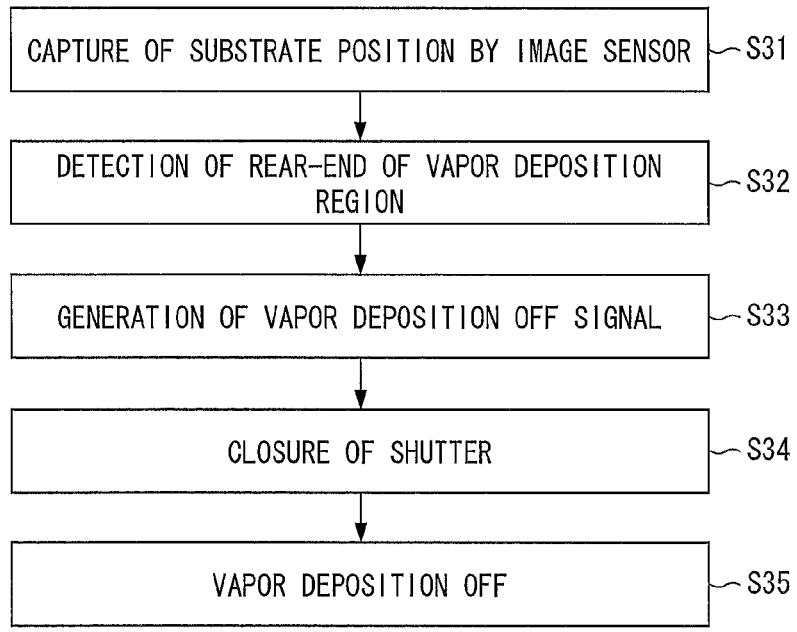

F I G. 1 7
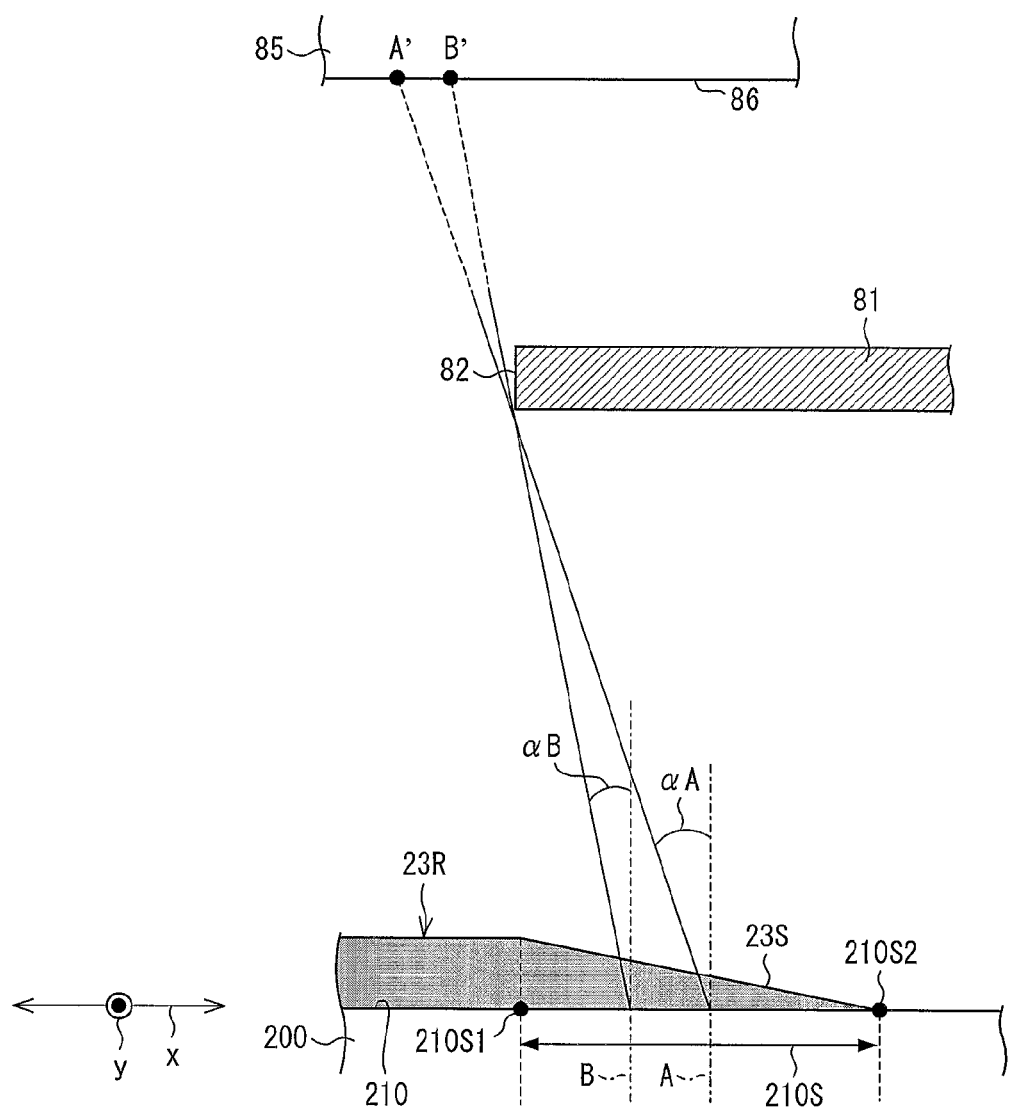

SUBSTRATE TO WHICH FILM IS FORMED, ORGANIC EL DISPLAY DEVICE, AND VAPOR DEPOSITION METHOD

CROSS REFERENCE TO RELATED APPLICATIONS

This is a U.S. National Phase patent application of PCT/JP2012/050616, filed Jan. 13, 2012, which claims priority to Japanese patent application no. 2011-009182, filed Jan. 19, 2011, each of which is hereby incorporated by reference in the present disclosure in its entirety.

TECHNICAL FIELD

The present invention relates to (i) a film formation substrate (a substrate to which a film is formed) having a plurality of vapor deposition regions which are aligned along a predetermined direction, in which vapor deposition regions respective vapor-deposited films are formed, (ii) an organic EL display device and (iii) a vapor deposition method.

BACKGROUND ART

Recent years have witnessed practical use of a flat-panel display in various products and fields. This has led to a demand for a flat-panel display that is larger in size, achieves higher image quality, and consumes less power.

Under such circumstances, great attention has been drawn to an organic EL display device that (i) includes an organic electroluminescence (hereinafter abbreviated to "EL") element which uses EL of an organic material and that (ii) is an all-solid-state flat-panel display which is excellent in, for example, low-voltage driving, high-speed response, and self-emitting.

An organic EL display device includes, for example, (i) a substrate made up of members such as a glass substrate and TFTs (thin film transistors) provided to the glass substrate and (ii) organic EL elements provided on the substrate and connected to the TFTs.

An organic EL element is a light-emitting element capable of high-luminance light emission based on low-voltage direct-current driving, and includes in its structure first electrodes, an organic EL layer, and a second electrode stacked on top of one another in that order, the first electrodes being connected to the respective TFT. The organic EL layer between the first electrodes and the second electrode is an organic layer including a stack of layers such as a hole injection layer, a hole transfer layer, an electron blocking layer, a luminescent layer, a hole blocking layer, an electron transfer layer, and an electron injection layer.

A full-color organic EL display device typically includes organic EL elements of red (R), green (G), and blue (B) as sub-pixels aligned on a substrate. The full-color organic EL display device carries out an image display by, with use of TFTs, selectively causing the organic EL elements to each emit light with a desired luminance.

Such an organic EL display device is produced through a process that forms, for each organic EL element serving as a light-emitting element, a pattern of a luminescent layer made of an organic luminescent material which emits light of at least the above three colors (see, for example, Patent Literatures 1 to 3).

Such formation of a luminescent layer pattern is performed by a method such as (i) a vacuum vapor deposition method that uses a vapor deposition mask referred to as a shadow mask, (ii) an inkjet method, and (iii) a laser transfer method.

The production of, for example, a low-molecular organic EL display (OLED) has conventionally used a vapor deposition method involving a shadow mask, the vapor deposition method forming organic layers by selective application.

The vacuum vapor deposition method involving a shadow mask uses a shadow mask (full-cover contact type shadow mask) that is so sized as to allow vapor deposition to be performed throughout the entire vapor deposition region of a substrate. The shadow mask is typically equivalent in size to the substrate.

FIG. 26 is a cross-sectional view schematically illustrating a configuration of a conventional vapor deposition device involving a shadow mask.

The vacuum vapor deposition method involving a shadow mask, as illustrated in FIG. 26, forms a pattern by (i) placing a substrate 301 and a vapor deposition source 302 at such positions that the substrate 301 and the vapor deposition source 302 face each other, (ii) forming, in a shadow mask 303, openings 304 corresponding to a pattern of a portion of a target vapor deposition region so that no vapor deposition particles are adhered to a region other than the vapor deposition region, and (iii) depositing vapor deposition particles onto the substrate 301 through the openings 304.

The substrate 301 is placed in a vacuum chamber (not illustrated). The vapor deposition source 302 is fixed below the substrate 301. The shadow mask 303 is either fixed so as to be near (or in close contact with) the substrate 301 or moved relative to the substrate 301 while the substrate 301 and the vapor deposition source 302 are fixed to an inner wall of the vacuum chamber.

Patent Literature 1, for example, discloses a method that involves a load-lock vapor deposition source, the method (i) aligning a mask and a substrate with each other, next (ii) performing vacuum vapor deposition of a first luminescent material from directly below the substrate to form an arrangement of first light-emitting sections each substantially identical in shape to an opening of the mask, then (iii) shifting the mask, and (iv) performing vacuum vapor deposition of a second luminescent material from directly below the substrate to form an arrangement of second light-emitting sections each substantially identical in shape to the opening of the mask.

Patent Literature 2 discloses a method involving a partition wall that is so provided on a substrate, to which display electrodes are provided, as to protrude from the substrate and surround the display electrodes, the method (i) placing a mask on a top surface of the partition wall, (ii) depositing an organic EL medium on the display electrodes surrounded by the partition wall, then (iii) shifting the mask so that an opening of the mask is shifted from the position directly above a display electrode to the position directly above an adjacent display electrode, thereby sequentially forming luminescent layers each substantially identical in shape to the opening of the mask.

The vacuum vapor deposition method involving a shadow mask is used not only to form a luminescent layer but also to form an electrode pattern.

Patent Literature 4, for example, discloses a method for forming an electrode pattern, the method (i) aligning, in a mask equivalent in size to a substrate, short-diameter holes or long and narrow slit pores in a direction which intersects a direction in which the mask is shifted and (ii) performing vapor deposition of an electrode material while the mask is being shifted in a direction in which the short-diameter holes or slit pores are aligned.

In the vacuum vapor deposition method involving a shadow mask as described above, the shadow mask is fixed (for example, welded) to a mask frame under tension for prevention of, for example, bending and distortion.

The vacuum vapor deposition method involving a shadow mask forms a luminescent layer pattern or an electrode pattern that is a vapor-deposited film by (i) providing a shadow mask such as the above so as to be near (or in close contact with) a substrate and (ii) causing vapor deposition particles from a vapor deposition source to be deposited (adhered) onto a desired position of the substrate through an opening of the shadow mask.

CITATION LIST

Patent Literatures

Patent Literature 1
Japanese Patent Application Publication, Tokukai, No. 2000-188179 A (Publication Date: Jul. 4, 2000) [corresponding U.S. Pat. No. 6,294,892; Publication Date: Sep. 25, 2001]
Patent Literature 2
Japanese Patent Application Publication, Tokukaihei, No. 8-227276 A (Publication Date: Sep. 3, 1996) [corresponding U.S. Pat. No. 5,742,129; Publication Date: Apr. 21, 1998]
Patent Literature 3
Japanese Patent Application Publication, Tokukaihei, No. 9-167684 A (Publication Date: Jun. 24, 1997) [corresponding U.S. Pat. No. 5,688,551; Publication Date: Nov. 18, 1997]
Patent Literature 4
Japanese Patent Application Publication, Tokukaihei, No. 10-102237 A (Publication Date: Apr. 21, 1998)

SUMMARY OF INVENTION

Technical Problem

However, a conventional vapor deposition method has a problem that color mixture of light is likely to occur and/or a part that emits no light is likely to appear. According to a conventional vapor deposition method for forming a vapor-deposited film 305 while a substrate 301 and a mask 303 are kept close to each other (see (a) of FIG. 27), a pattern of the vapor-deposited film 305 is possibly displaced as illustrated in (b) of FIG. 27. Such displacement of the pattern of the vapor-deposited film 305 causes (i) the vapor-deposited film 305 formed in a luminescent region 307a of a pixel 306a to partially overlap a luminescent region 307b of an adjacent pixel 306b, thereby causing color mixture (that is, colors are mixed and/or light, which has a color which is supposed to be obtained, is not emitted) and/or (ii) the vapor-deposited film 305 to become partially absent in the luminescent region 307a of the pixel 306a, thereby causing short circuit and/or a part that emits no light.

More specifically, according to the conventional vapor deposition method, the vapor-deposited film 305 is formed so as to have steep end parts 305t (see (b) of FIG. 27). Therefore, a full-thickness part of the vapor-deposited film 305 overlaps the luminescent region 307b of the adjacent pixel 306b in a first case where the vapor-deposited film 305 overlaps the luminescent region 307b of the adjacent pixel 306b, whereas no vapor-deposited film 305 exists at all in part of the luminescent region 307a of the pixel 306a in a second case where the vapor-deposited film 305 is partially absent in the luminescent region 307a of the pixel 306a.

That is, such a problem causes the full thickness of the vapor-deposited film 305 to affect emission properties of pixels. This ultimately has a great effect on an image quality.

Specifically, in the first case, an emission property of the adjacent pixel 306b remarkably deteriorates (that is, colors are mixed). On the other hand, in the second case, (i) a part of the luminescent region 307a of the pixel 306a becomes a part that emits no light, and therefore decreases in luminance and (ii) a short circuit occurs, whereby a luminance decreases, an element is damaged, and a life of the element is shortened.

Such a problem would result in a decrease in yield rate, thereby raising manufacturing costs.

The present invention was made in view of the problems, and an object of the present invention is to provide (i) a film formation substrate, an organic EL display device, and a vapor deposition method, each of which is capable of, even if a pattern of a vapor-deposited film is displaced, reducing the effects of such displacement on an image quality.

Solution to Problem

In order to attain the object, a film formation substrate of the present invention is configured to be a film formation substrate having a plurality of vapor deposition regions (i) which are arranged along a predetermined direction and (ii) in which respective vapor-deposited films are provided, each of the vapor-deposited films having inclined side surfaces in opposite parts, along the predetermined direction, of the each of the vapor-deposited films, the inclined side surfaces being inclined with respect to a direction normal to the film formation substrate, and a width, in the predetermined direction, of the each of the vapor-deposited films is larger than the sum of (i) a width, in the predetermined direction, of a corresponding one of the plurality of vapor deposition regions and (ii) a width, in the predetermined direction, of a region between the corresponding one of the plurality of vapor deposition regions and an adjacent one of the plurality of vapor deposition regions which is adjacent to the corresponding one of the plurality of vapor deposition regions.

A vapor deposition method of the present invention is arranged to be a vapor deposition method for forming vapor-deposited films in a respective plurality of vapor deposition regions of a film formation substrate, which vapor deposition regions are arranged along a predetermined direction, the vapor deposition method including the steps of: (a) preparing a mask unit which includes (i) a vapor deposition mask that has openings corresponding to the respective plurality of vapor deposition regions and (ii) a vapor deposition source provided so as to face the vapor deposition mask; (b) positioning the vapor deposition mask and the film formation substrate relative to each other with respect to the predetermined direction; and (c) forming the vapor-deposited films in the respective plurality of vapor deposition regions by depositing vapor deposition particles on the film formation substrate via the openings, the vapor deposition particles being injected from the vapor deposition source, in the step (c), the vapor-deposited films being formed so that (i) each of the vapor-deposited films covers a corresponding one of the respective plurality of vapor deposition regions, (ii) each of the vapor-deposited films has inclined side surfaces in opposite parts, along the predetermined direction, of the each of the vapor-deposited films, the inclined side surfaces being inclined with respect to a direction normal to the film formation substrate and (iii) a width, in the predetermined direction, of the each of the vapor-deposited films is larger than the sum of a width, in the predetermined direction, of the corresponding one of the plurality of vapor deposition regions and a width, in the predetermined direction, of a region between the corresponding one of the plurality of vapor deposition regions and adjacent one of the plurality of vapor deposition regions which is adjacent to the corresponding one of the plurality of vapor deposition regions.

According to the film formation substrate and the vapor deposition method, the width, in the predetermined direction, of the each of the vapor-deposited films is larger than the sum of (i) the width, in the predetermined direction, of the corresponding one of the plurality of vapor deposition regions and (ii) the width, in the predetermined direction, of the region between the corresponding one of the plurality of vapor deposition regions and the adjacent one of the plurality of vapor deposition regions which is adjacent to the corresponding one of the plurality of vapor deposition regions. Therefore, even in a case where a vapor-deposited film is displaced relative to the film formation substrate toward one side along the predetermined direction, one of inclined side surfaces of the vapor-deposited film, which one is on the other side along the predetermined direction, still covers a corresponding vapor deposition region. It is therefore possible to prevent (i) the film-deposited film from becoming absent in the corresponding vapor deposition region and (ii) a short circuit from occurring.

The vapor-deposited film has the inclined side surfaces in the opposite parts, along the predetermined direction, of the each of the vapor-deposited films, the inclined side surfaces being inclined with respect to the direction normal to the film formation substrate. Therefore, even in a case where the vapor-deposited film overlaps its adjacent vapor-deposited region by being displaced relative to the film formation substrate, only one of the inclined side surfaces of the vapor-deposited film overlaps the adjacent vapor deposition region. That is, a full-thickness part of the vapor-deposited film (that is, a thickness of a flat part of the vapor-deposited film) does not overlap the adjacent vapor-deposited region. It is therefore possible to reduce a degree of color mixture.

As such, even in a case where the vapor-deposited film is displaced relative to the film formation substrate, it is possible to attain (i) prevention of absence of a film and a short circuit and (ii) reduction in degree of color mixture. It is therefore possible to form vapor-deposited films with a large margin therebetween in case of displacement of a vapor-deposited film relative to the film formation substrate. This allows a yield rate to rise, thereby reducing manufacturing costs. Further, even in the case, an effect of such displacement on an image quality can be reduced.

Advantageous Effects of Invention

A film formation substrate of the present invention is configured to be a film formation substrate having a plurality of vapor deposition regions (i) which are arranged along a predetermined direction and (ii) in which respective vapor-deposited films are provided, each of the vapor-deposited films having inclined side surfaces in opposite parts, along the predetermined direction, of the each of the vapor-deposited films, the inclined side surfaces being inclined with respect to a direction normal to the film formation substrate, and a width, in the predetermined direction, of the each of the vapor-deposited films is larger than the sum of (i) a width, in the predetermined direction, of a corresponding one of the plurality of vapor deposition regions and (ii) a width, in the predetermined direction, of a region between the corresponding one of the plurality of vapor deposition regions and an adjacent one of the plurality of vapor deposition regions which is adjacent to the corresponding one of the plurality of vapor deposition regions.

A vapor deposition method of the present invention is arranged to be a vapor deposition method for forming vapor-deposited films in a respective plurality of vapor deposition regions of a film formation substrate, which vapor deposition regions are arranged along a predetermined direction, the vapor deposition method including the steps of: (a) preparing a mask unit which includes (i) a vapor deposition mask that has openings corresponding to the respective plurality of vapor deposition regions and (ii) a vapor deposition source provided so as to face the vapor deposition mask; (b) positioning the vapor deposition mask and the film formation substrate relative to each other with respect to the predetermined direction; and (c) forming the vapor-deposited films in the respective plurality of vapor deposition regions by depositing vapor deposition particles on the film formation substrate via the openings, the vapor deposition particles being injected from the vapor deposition source, in the step (c), the vapor-deposited films being formed so that (i) each of the vapor-deposited films covers a corresponding one of the respective plurality of vapor deposition regions, (ii) each of the vapor-deposited films has inclined side surfaces in opposite parts, along the predetermined direction, of the each of the vapor-deposited films, the inclined side surfaces being inclined with respect to a direction normal to the film formation substrate and (iii) a width, in the predetermined direction, of the each of the vapor-deposited films is larger than the sum of a width, in the predetermined direction, of the corresponding one of the plurality of vapor deposition regions and a width, in the predetermined direction, of a region between the corresponding one of the plurality of vapor deposition regions and adjacent one of the plurality of vapor deposition regions which is adjacent to the corresponding one of the plurality of vapor deposition regions.

Therefore, even in a case where a vapor-deposited film is displaced relative to the film formation substrate, it is possible to attain (i) prevention of absence of a film and a short circuit and (ii) reduction in degree of color mixture. That is, even in the case, an effect of such displacement on an image quality can be reduced.

Figure 5:
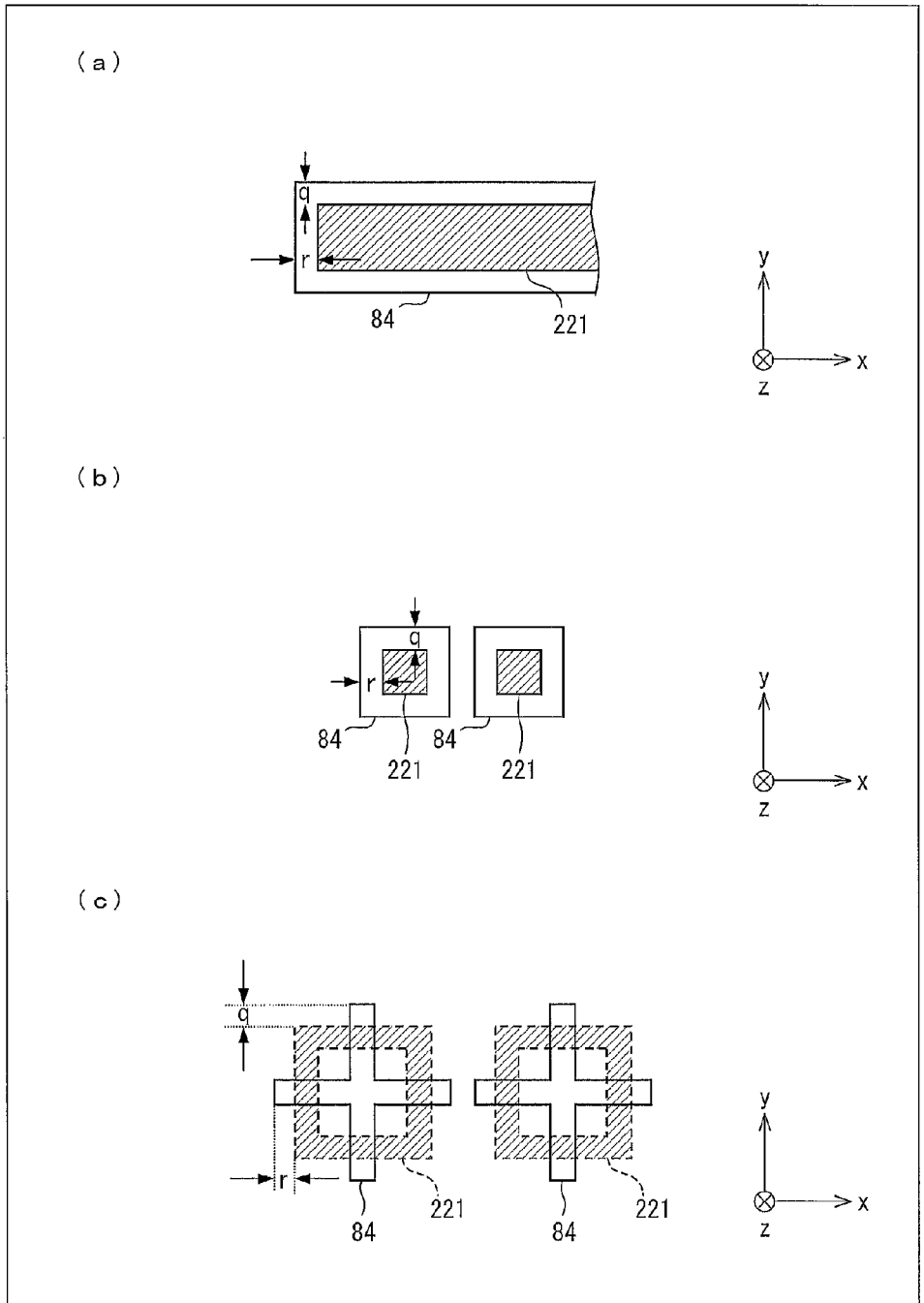

(a) through (c) of FIG. 5 are each a diagram illustrating an example shape of an alignment marker provided to the film formation substrate and a vapor deposition mask according to Embodiment 1 of the present invention.

Figure 6:
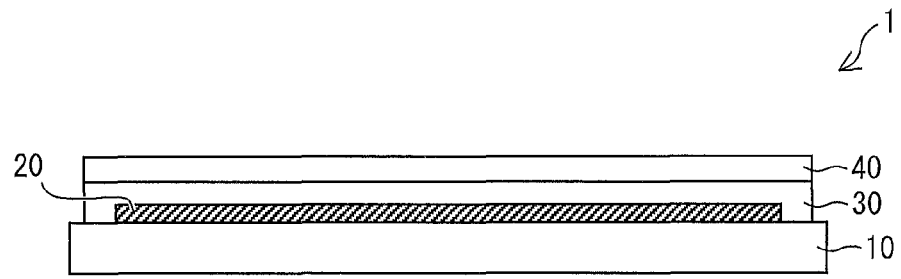

FIG. 6 is a cross-sectional view schematically illustrating a configuration of an organic EL display device for carrying out an RGB full color display.

Figure 7:
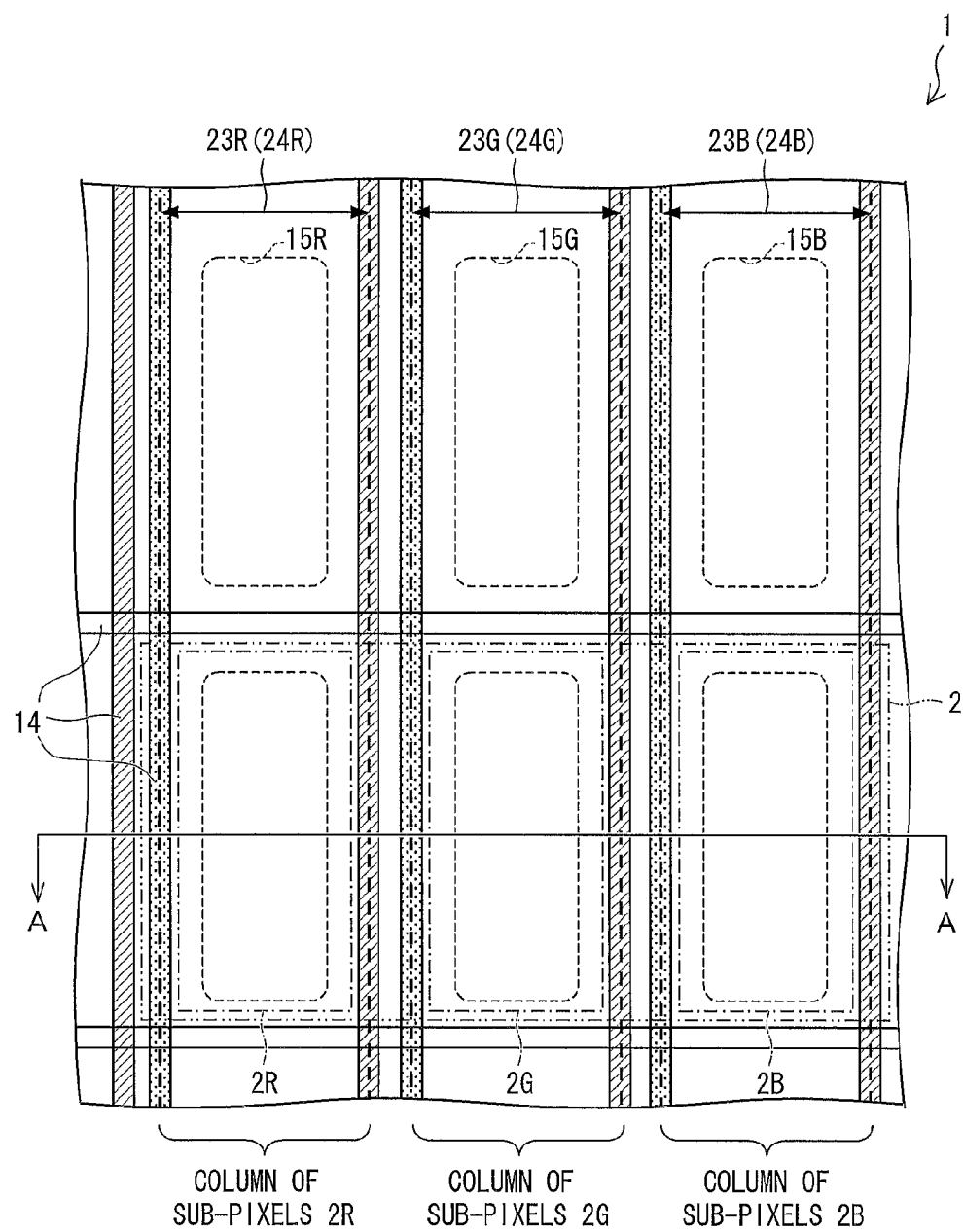

FIG. 7 is a plan view illustrating an arrangement of pixels constituting the organic EL display device illustrated in FIG. 6.

FIG. 8 is a cross-sectional view, taken along line A-A, illustrating a TFT substrate in the organic EL display device illustrated in FIG. 7.

Figure 9:
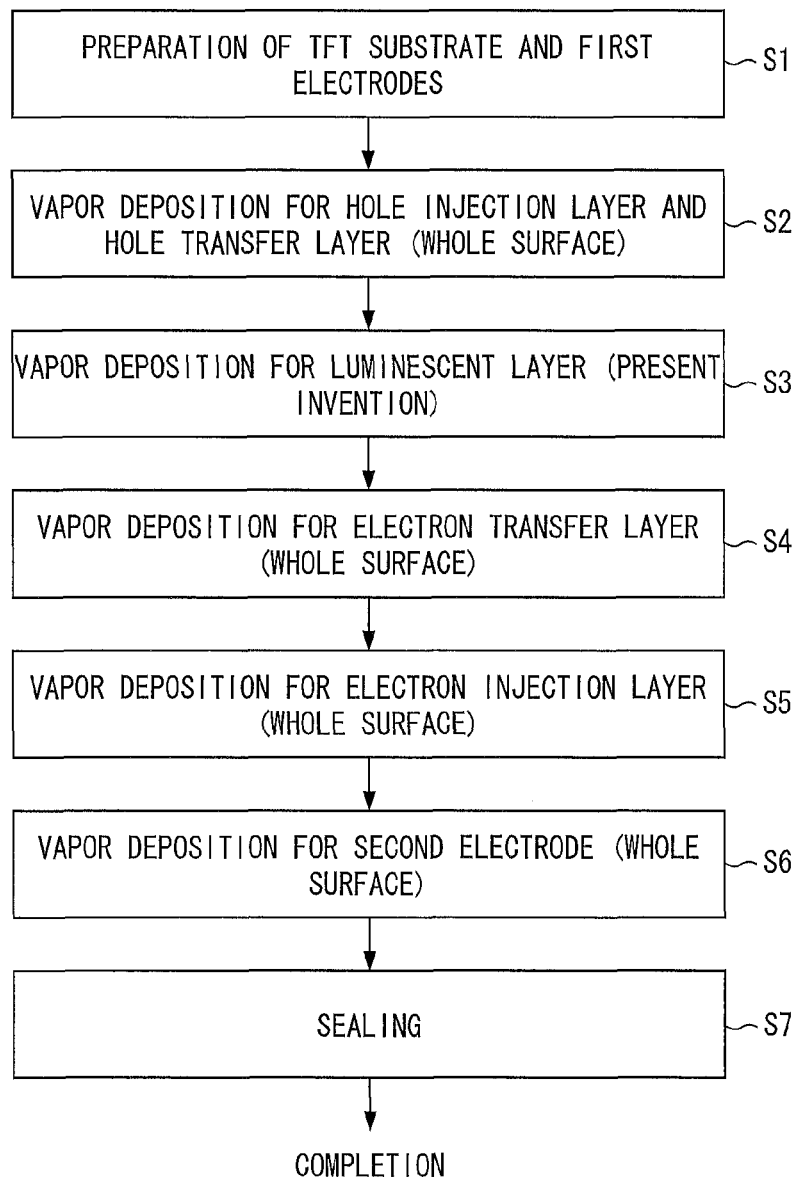

FIG. 9 is a flowchart indicating successive steps for producing the organic EL display device according to Embodiment 1 of the present invention.

FIG. 10 is a flowchart indicating an example method for forming a predetermined pattern on a TFT substrate with use of the vapor deposition device according to Embodiment 1 of the present invention.

FIG. 11 is a flowchart indicating an alignment adjustment method.

FIG. 12 is a flowchart indicating a flow of a vapor deposition control carried out when vapor deposition is turned OFF.

Figure 13:
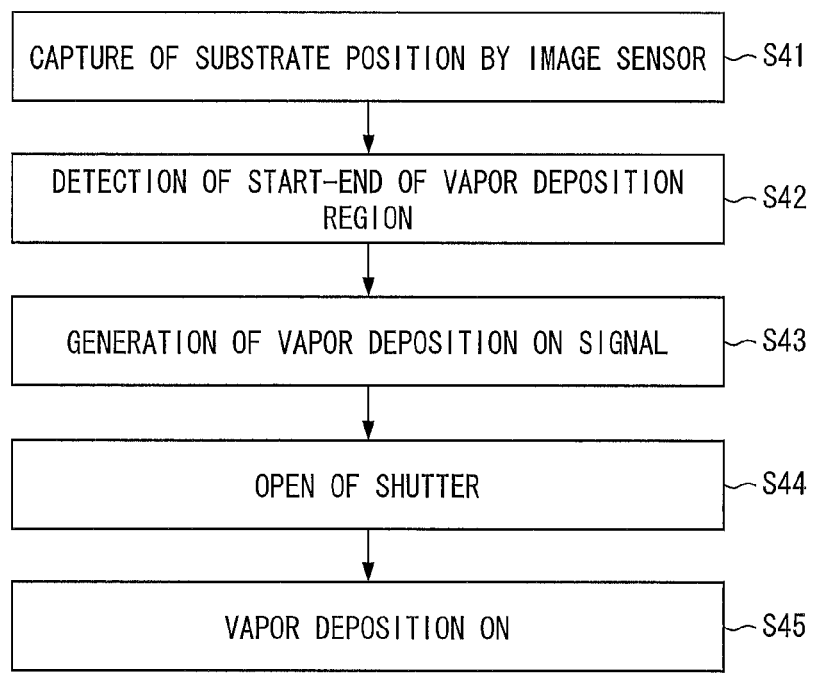

FIG. 13 is a flowchart indicating a flow of a vapor deposition control carried out when vapor deposition is turned ON.

Figure 14:
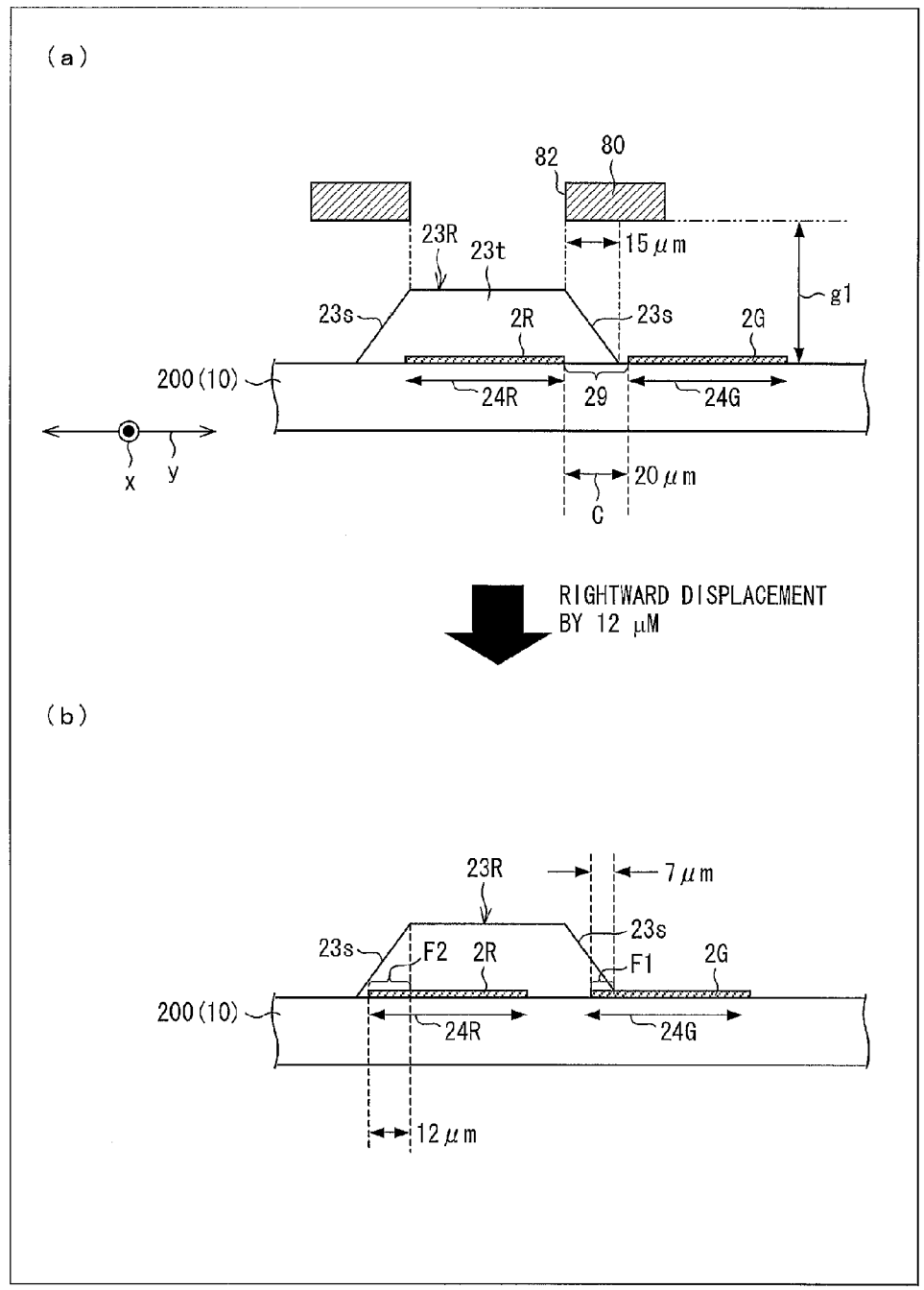

FIG. 14 illustrates a vapor deposition method in accordance with Embodiment 1 of the present invention, in which method a width of an opening of a mask is identical to that of a luminescent region. (a) of FIG. 14 is a cross-sectional view illustrating a state where a pattern of a luminescent layer is not displaced. (b) of FIG. 14 is a cross-sectional view illustrating a state where the pattern of the luminescent layer is displaced.

Figure 15:
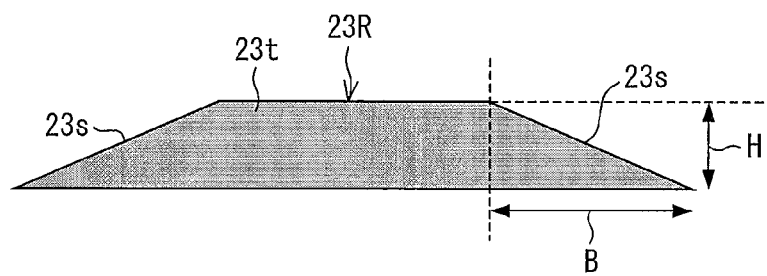

FIG. 15 is an explanatory view describing an upper limit and a lower limit of an inclined side surface of a luminescent layer in accordance with Embodiment 1 of the present invention.

Figure 16:
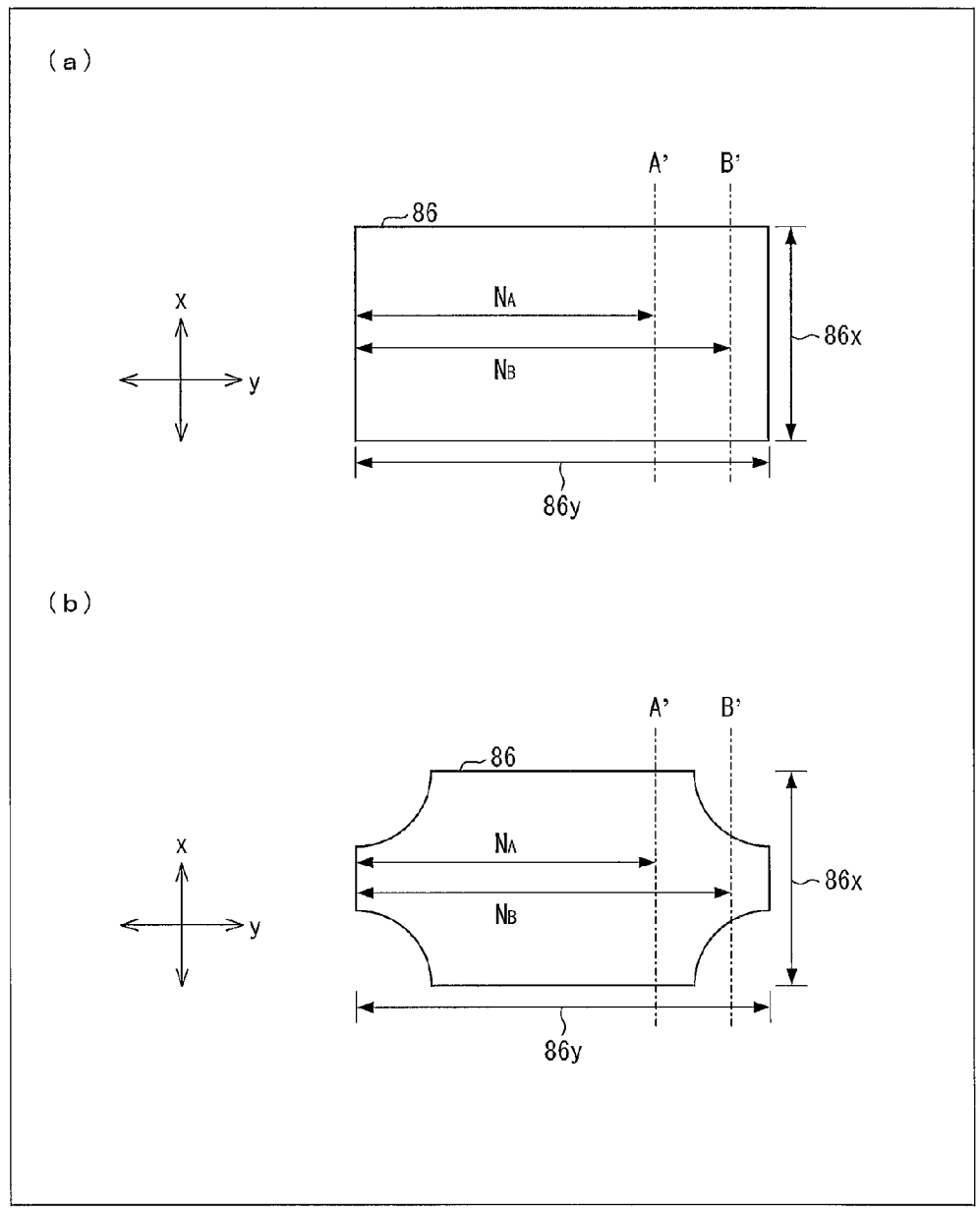

(a) of FIG. 16 is a view showing an example of a shape of a nozzle opening in a case where an inclined side surface of a luminescent layer is flat. (b) of FIG. 16 is a view showing an example of a shape of a nozzle opening in a case where an inclined side surface of a luminescent layer is curved.

FIG. 17 is an explanatory view describing a relationship between a shape of a nozzle opening and an inclined side surface.

Figure 18:
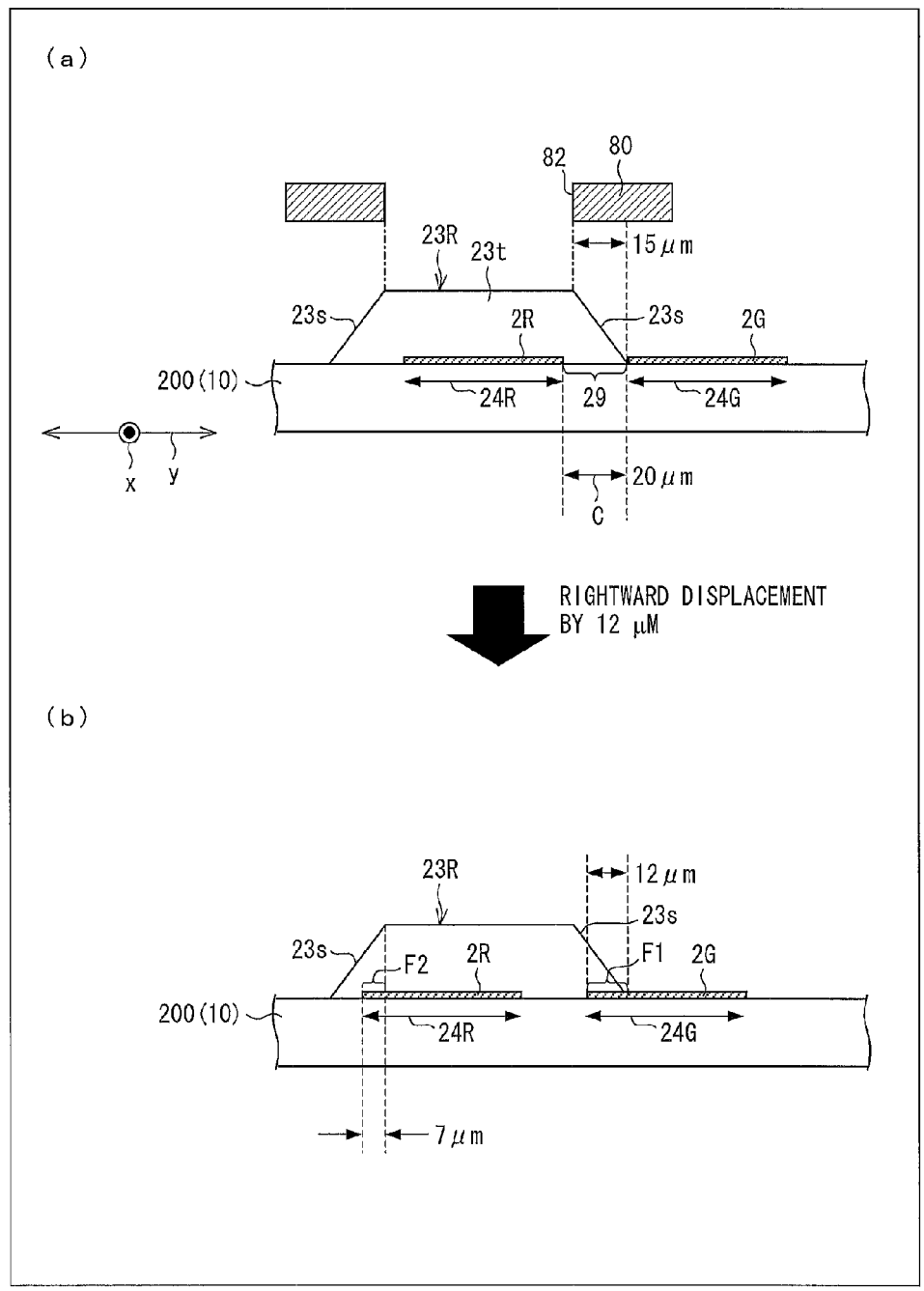

FIG. 18 illustrates the vapor deposition method in accordance with Embodiment 1 of the present invention, in which method a width of an opening of a mask is larger than that of a luminescent region. (a) of FIG. 18 is a cross-sectional view illustrating a state where a pattern of a luminescent layer is not displaced. (b) of FIG. 18 is a cross-sectional view illustrating a state where the pattern of the luminescent layer is displaced.

Figure 19:
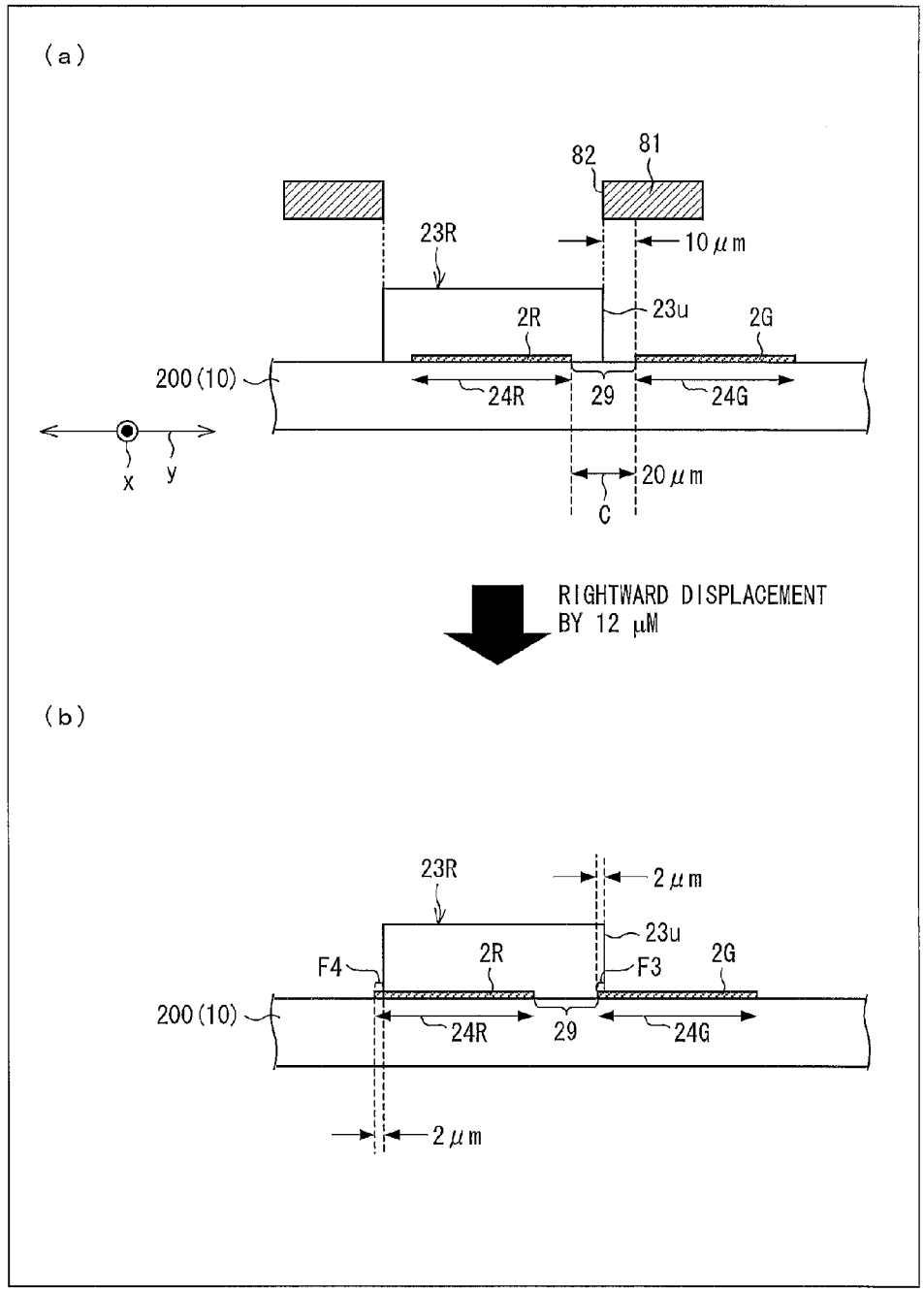

FIG. 19 illustrates a conventional vapor deposition method in which an opening in a mask has a typical width. (a) of FIG. 19 is a cross-sectional view illustrating a state where a pattern of a luminescent layer is not displaced. (b) of FIG. 19 is a cross-sectional view illustrating a state where the pattern of the luminescent layer is displaced.

Figure 20:
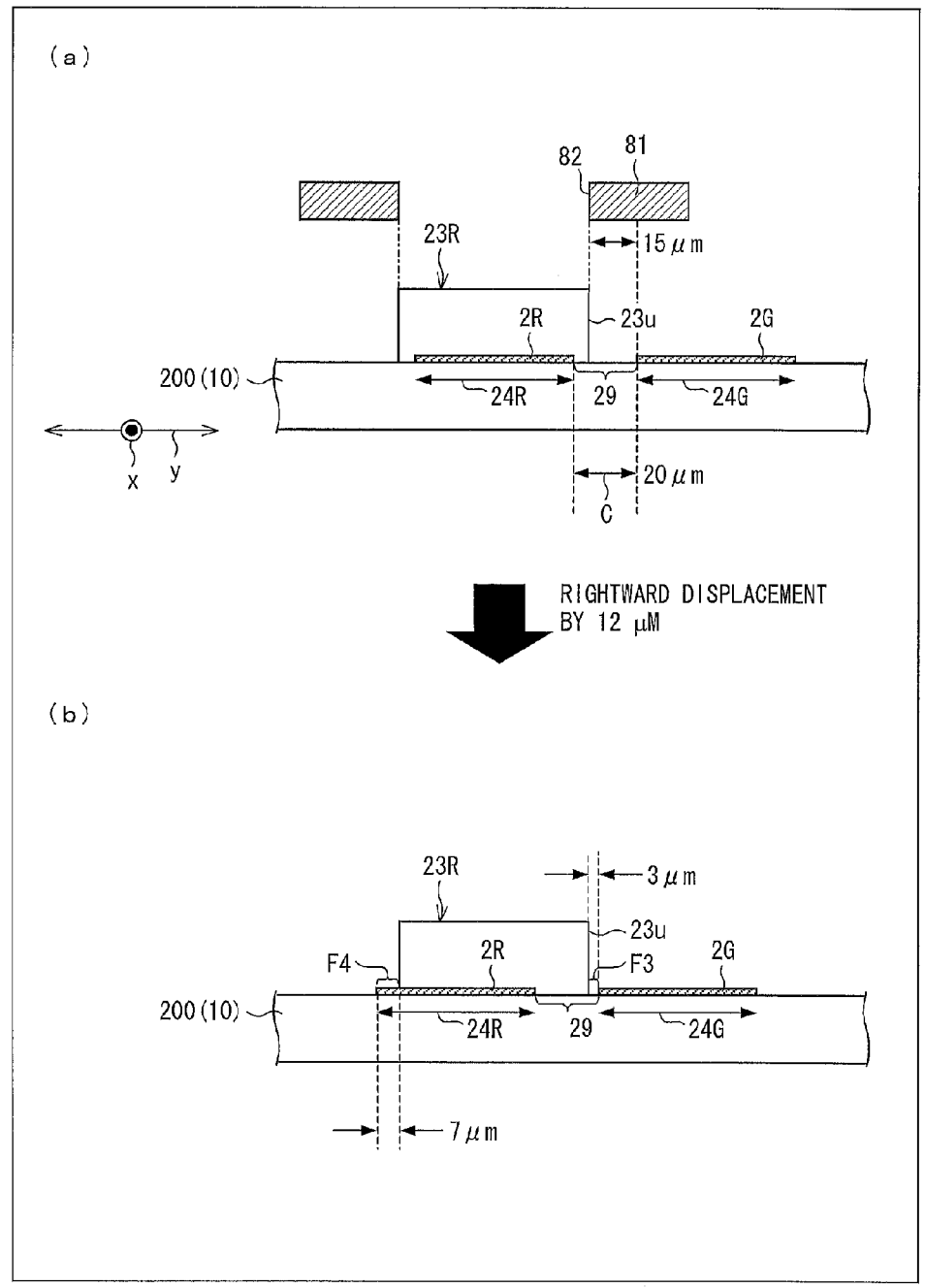

FIG. 20 illustrates the conventional vapor deposition method in which an opening in a mask has a width smaller than the typical width. (a) of FIG. 20 is a cross-sectional view illustrating a state where a pattern of a luminescent layer is not displaced. (b) of FIG. 20 is a cross-sectional view illustrating a state where the pattern of the luminescent layer is displaced.

Figure 21:
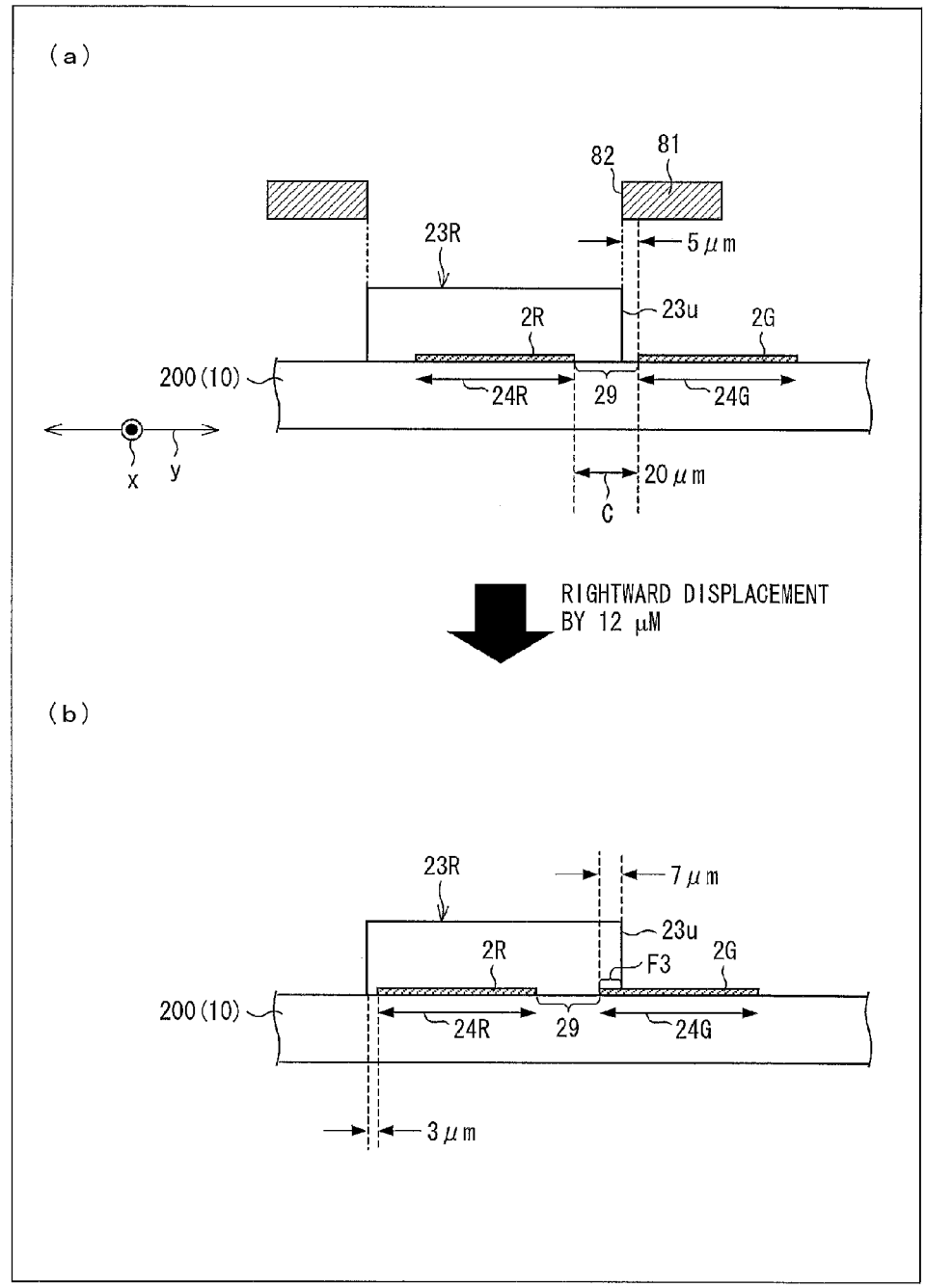

FIG. 21 illustrates the conventional vapor deposition method in which an opening of a mask has a width larger than the typical width. (a) of FIG. 21 is a cross-sectional view illustrating a state where a pattern of a luminescent layer is not displaced. (b) of FIG. 21 is a cross-sectional view illustrating a state where the pattern of the luminescent layer is displaced.

Figure 22:
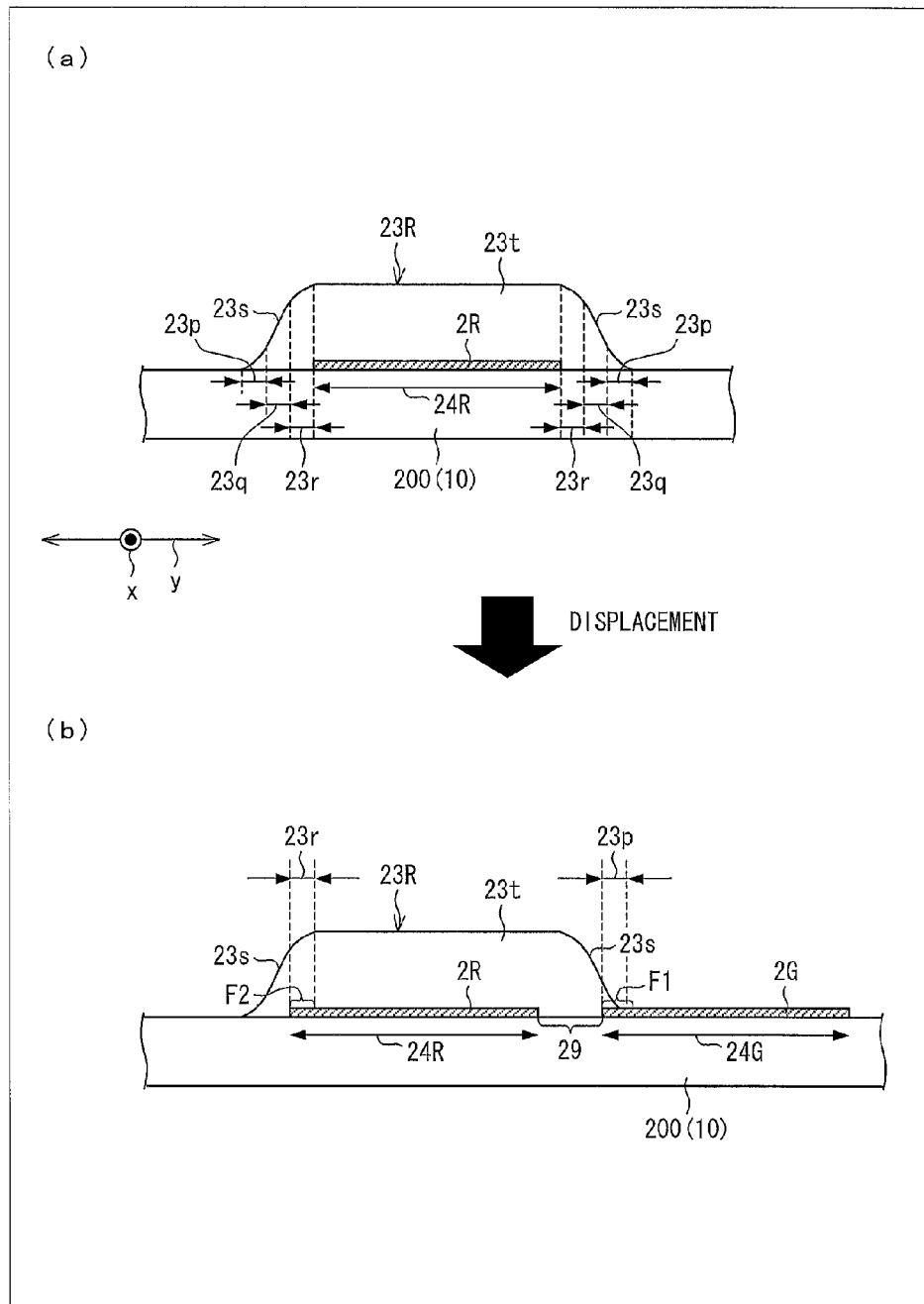

FIG. 22 illustrates the vapor deposition method in accordance with Embodiment 1 of the present invention, in which method an inclined side surface of a luminescent layer is curved. (a) of FIG. 22 is a cross-sectional view illustrating a state where a pattern of the luminescent layer is not displaced. (b) of FIG. 22 is a cross-sectional view illustrating a state where the pattern of the luminescent layer is displaced.

Figure 23:
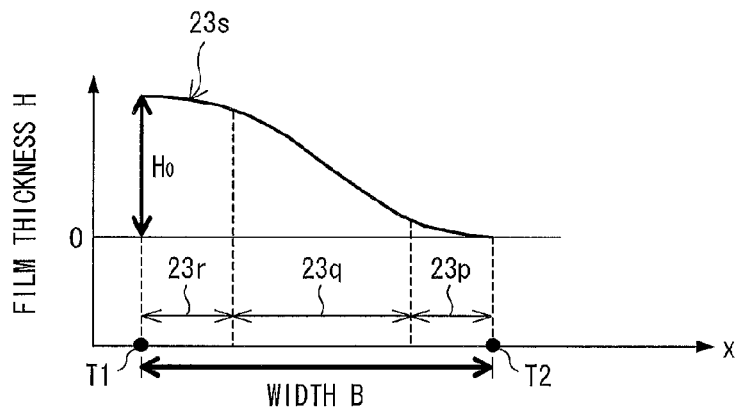

FIG. 23 is an explanatory view describing a relationship between a thickness and a width of a luminescent layer in a case where an inclined side surface of the luminescent layer is represented by a cosine function.

Figure 24:
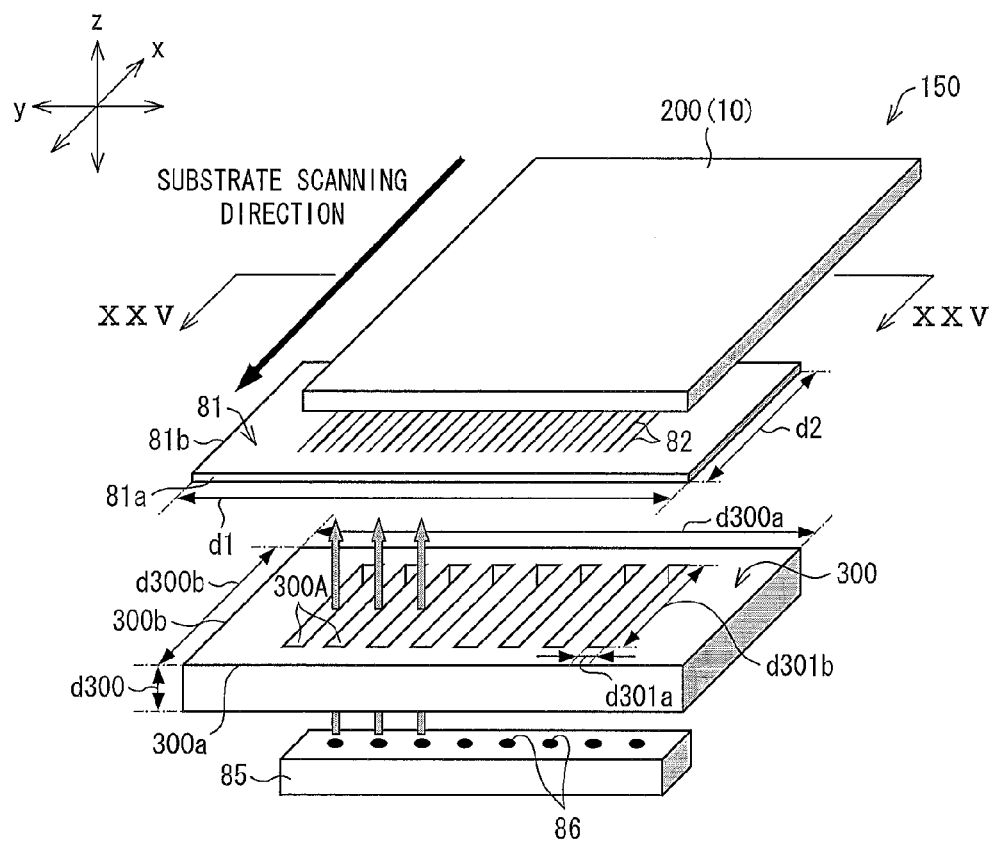

FIG. 24 is a view schematically illustrating a configuration of a vapor deposition device in accordance with Embodiment 2 of the present invention.

Figure 25:
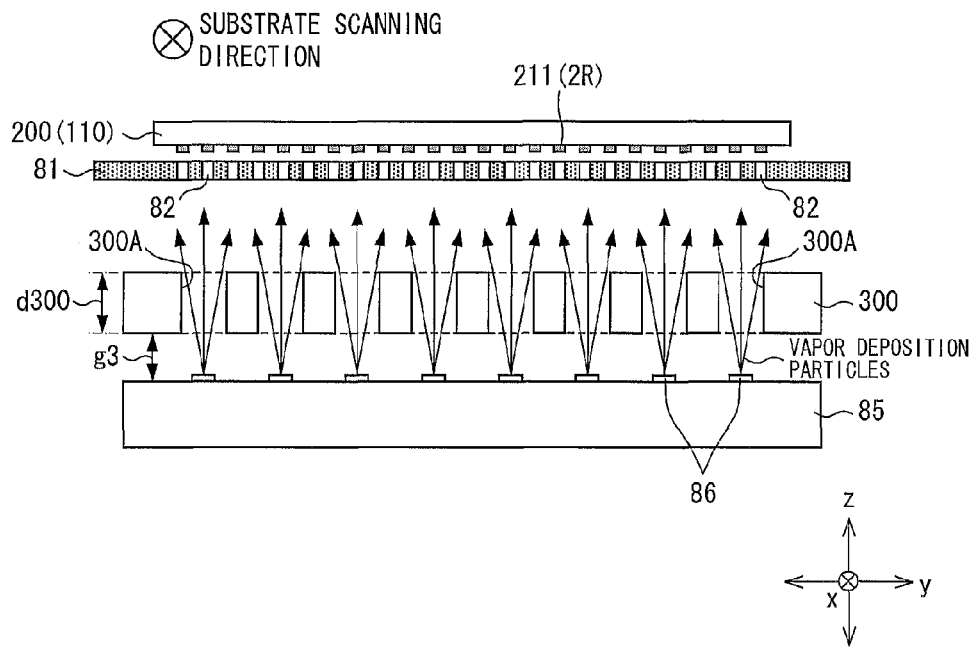

FIG. 25 is a cross-sectional view taken along line XXV-XXV of FIG. 24.

Figure 26:
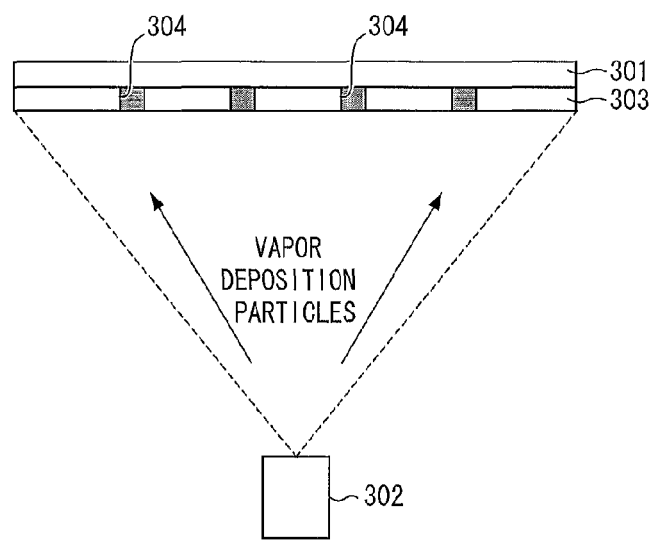

FIG. 26 is a cross-sectional view schematically illustrating a configuration of a conventional vapor deposition device including a shadow mask.

Figure 27:
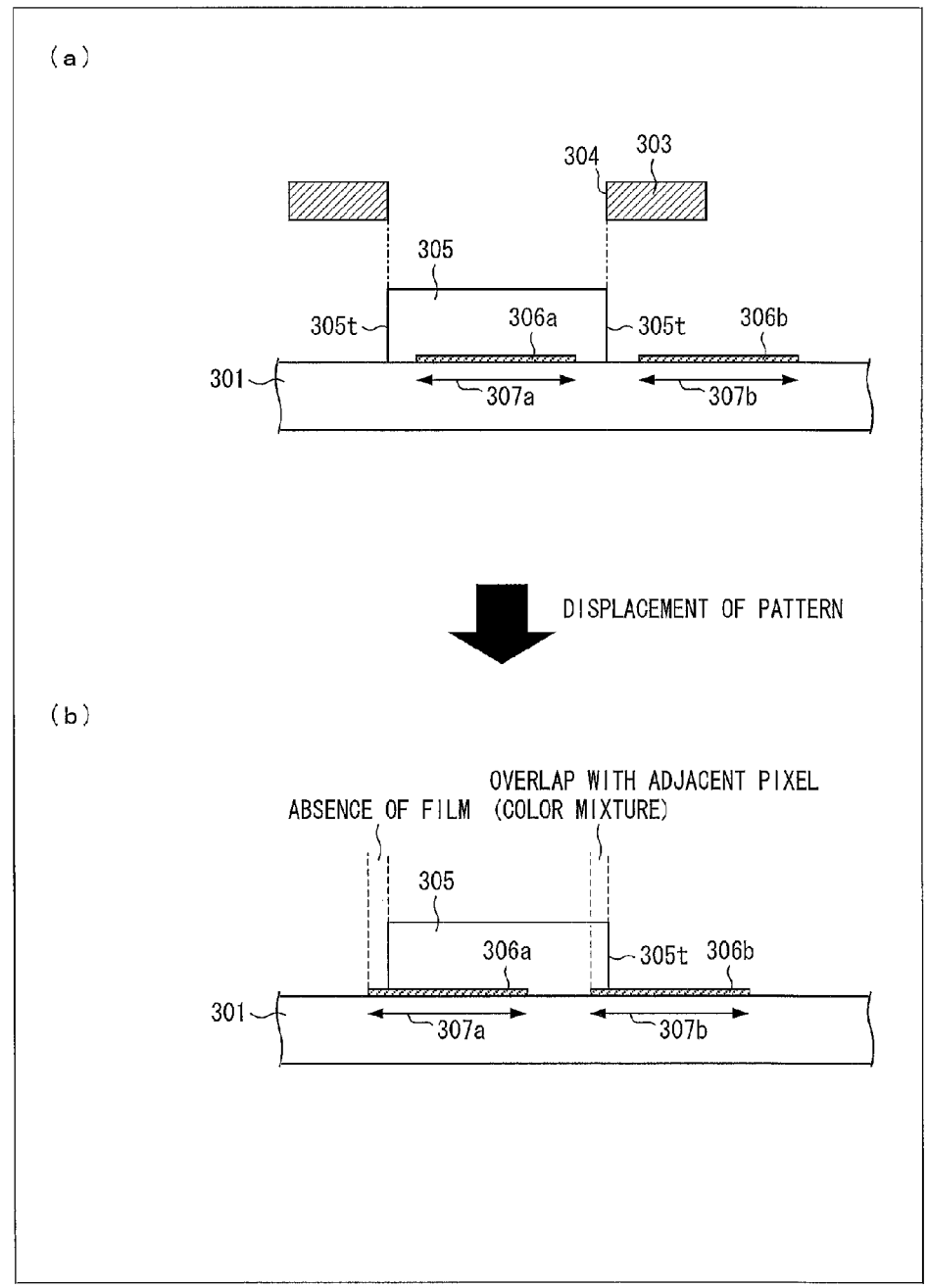

FIG. 27 illustrates a conventional vapor deposition method. (a) of FIG. 27 is a cross-sectional view illustrating a state where a pattern of a vapor-deposited film is not displaced. (b) of FIG. 27 is a cross-sectional view illustrating a state where the pattern of the vapor-deposited film is displaced.

DESCRIPTION OF EMBODIMENTS

Embodiments of the present invention are described below in detail.

Embodiment 1

An embodiment of the present invention is described below with reference to FIGS. 1 through 21.

The present embodiment describes, as an example vapor deposition method involving a vapor deposition device of the present embodiment, a method for producing an organic EL display device that (i) is of a bottom emission type, that is, extracts light from a TFT substrate side, and that (ii) carries out an RGB full color display.

The description first deals with the overall configuration of the organic EL display device.

FIG. 6 is a cross-sectional view schematically illustrating a configuration of the organic EL display device that carries out an RGB full color display. FIG. 7 is a plan view illustrating an arrangement of pixels included in the organic EL display device illustrated in FIG. 6. FIG. 8 is a cross-sectional view, taken along line A-A in FIG. 7, of a TFT substrate included in the organic EL display device illustrated in FIG. 7.

As illustrated in FIG. 6, an organic EL display device 1 produced in the present embodiment includes: a TFT substrate 10 including TFTs 12 (see FIG. 8); organic EL elements 20 provided on the TFT substrate 10 and connected to the respective TFTs 12; an adhesive layer 30; and a sealing substrate 40, which are arranged in that order.

The organic EL elements 20, as illustrated in FIG. 6, are contained between the TFT substrate 10 and the sealing substrate 40 by attaching the TFT substrate 10, on which the organic EL elements 20 are provided, to the sealing substrate 40 with use of the adhesive layer 30.

The organic EL display device 1, in which the organic EL elements 20 are contained between the TFT substrate 10 and the sealing substrate 40 as described above, prevents infiltration of oxygen, moisture and the like present outside into the organic EL elements 20.

As illustrated in FIG. 8, the TFT substrate 10 includes, as a supporting substrate, a transparent insulating substrate 11 such as a glass substrate. The insulating substrate 11 is, as illustrated in FIG. 7, provided with a plurality of wires 14 including (i) a plurality of gate lines laid in the horizontal direction and (ii) a plurality of signal lines laid in the vertical direction and intersecting with the gate lines. The gate lines are connected to a gate line driving circuit (not illustrated) that drives the gate lines, whereas the signal lines are connected to a signal line driving circuit (not illustrated) that drives the signal lines.

The organic EL display device 1 is a full-color, active matrix organic EL display device. The organic EL display device 1 includes, on the insulating substrate 11 and in regions defined by the wires 14, sub-pixels 2R, 2G, and 2B which are (i) arranged in a matrix manner and (ii) made up of respective red (R), green (G), and blue (B) organic EL elements 20.

In other words, the regions defined by the wires 14 (i) each correspond to a single sub-pixel (dot), and (ii) provide a red (R) luminescent region (vapor deposition region) 24R, a green (G) luminescent region 24G, and a blue (B) luminescent region 24B for the sub-pixels 2R, 2G, and 2B, respectively.

A pixel 2 (that is, a single pixel) includes three sub-pixels: a red sub-pixel 2R transmitting red light; a green sub-pixel 2G transmitting green light; and a blue sub-pixel 2B transmitting blue light.

The sub-pixels 2R, 2G, and 2B have openings 15R, 15G, and 15B which are covered by different colors of stripe-shaped luminescent layers (vapor-deposited films) 23R, 23G, and 23B, respectively. The openings 15R, 15G, and 15B serve as the luminescent regions 24R, 24G, and 24B, which emit respective different colors of light in sub-pixels 2R, 2G, and 2B. Note that the luminescent regions 24R, 24G, and 24B are formed in a stripe shape, and the luminescent layers 23R, 23G, and 23B are formed in a stripe shape by being formed in their corresponding luminescent regions 24R, 24G, and 24B.

The luminescent layers 23R, 23G, and 23B are each formed in a pattern by vapor deposition. The openings 15R, 15G, and 15B are described below in detail.

The sub-pixels 2R, 2G, and 2B include the respective TFTs 12 which are connected to first electrodes 21 of the organic EL elements 20, respectively. The sub-pixels 2R, 2G, and 2B each have an emission intensity that is determined by (i) scan through the wires 14 and (ii) selection of the TFTs 12. As described above, the organic EL display device 1 carries out an image display by selectively causing the organic EL elements 20 to emit, by use of the respective TFTs 12, light with desired luminance.

The following describes in detail a configuration of the TFT substrate 10 and a configuration of the organic EL elements 20, both of which are included in the organic EL display device 1.

The description below first deals with the TFT substrate 10.

The TFT substrate 10, as illustrated in FIG. 8, includes on the transparent insulating substrate 11 such as a glass substrate: the TFTs 12 (switching elements); an interlayer film 13 (interlayer insulating film; planarizing film); and the wires 14; and edge covers 15, which are formed in that order.

The insulating substrate 11 is provided thereon with (i) the wires 14 and (ii) the TFTs 12 corresponding respectively to the sub-pixels 2R, 2G, and 2B. Since the configuration of a TFT has conventionally been well known, individual layers of a TFT 12 are not illustrated in the drawings or described herein.

The interlayer film 13 is provided on the insulating substrate 11 throughout the entire region of the insulating substrate 11 to cover the TFTs 12.

There are provided on the interlayer film 13 the first electrodes 21 of the respective organic EL elements 20.

The interlayer film 13 has contact holes 13a for electrically connecting the respective first electrode 21 of the organic EL elements 20 to the respective TFTs 12. This electrically connects the TFTs 12 to the respective organic EL elements 20 via the contact holes 13a.

The edge covers 15 are an insulating layer for preventing at least one of the first electrodes 21 and a second electrode 26 of the organic EL elements 20 from short-circuiting with each other due to, for example, (i) a reduced thickness of the organic EL layer in an edge section of the pattern of the first electrodes 21 or (ii) an electric field concentration.

The edge covers 15 are so formed on the interlayer film as to cover edge sections of the pattern of the first electrodes 21.

The edge covers 15 define the openings 15R, 15G, and 15B for the sub-pixels 2R, 2G, and 2B, respectively. The openings 15R, 15G, and 15B of the edge covers 15 define the respective luminescent regions of the sub-pixels 2R, 2G, and 2B.

The sub-pixels 2R, 2G, and 2B are, in other words, isolated from one another by the edge covers 15 which have an electrically insulating property. The edge covers 15 thus function as element isolation films as well.

Note that FIG. 8 shows an example where the edge covers 15 function as the element isolation films which isolate the sub-pixels 2R, 2G, and 2B from one another. However, the edge covers 15 do not necessarily need to function as the element isolation films. A description will be given as below on the assumption that the edge covers 15 are not thick enough to function as the element isolation films. Note that there is no problem even if such thin edge covers 15 are not provided.

The description below now deals with the organic EL elements 20.

The organic EL elements 20 are light-emitting elements capable of high-luminance light emission based on low-voltage direct-current driving, and include: the respective first electrodes 21; the organic EL layer; and the second electrode 26, which are provided on top of one another in that order.

The first electrode 21 is a layer which functions to inject (supply) positive holes into the organic EL layer. The first electrodes 21 are, as described above, connected to the respective TFTs 12 via the contact holes 13a.

The organic EL layer provided between the first electrodes 21 and the second electrode 26 includes, as illustrated in FIG. 8: a hole injection and transfer layer 22; the luminescent layers 23R, 23G, and 23B; an electron transfer layer 24; and an electron injection layer 25, which are formed in that order from a first electrode 21 side.

The above stack order intends to use (i) the first electrodes 21 as an anode and (ii) the second electrode 26 as a cathode. The stack order of the organic EL layer is reversed in the case where the first electrodes 21 serve as a cathode and the second electrode 26 serves as an anode.

A hole injection layer functions to increase efficiency in injecting positive holes into the luminescent layers 23R, 23G, and 23B. A hole transfer layer functions to increase efficiency in transferring positive holes to the luminescent layers 23R, 23G, and 23B. The hole injection and transfer layer 22 is so formed uniformly throughout the entire display region of the TFT substrate 10 as to cover the first electrodes 21 and the edge covers 15.

The present embodiment describes an example case involving, as the hole injection layer and the hole transfer layer, the hole injection and transfer layer 22 that integrally combines the hole injection layer with the hole transfer layer. The present embodiment is, however, not limited to the example case: The hole injection layer and the hole transfer layer can be provided as separate layers independent of each other.

There are provided on the hole injection and transfer layer 22 the luminescent layers 23R, 23G, and 23B which are so formed in correspondence with the respective sub-pixels 2R, 2G, and 2B as to cover the respective openings 15R, 15G, and 15B defined by the edge covers 15.

Each of the luminescent layers 23R, 23G, and 23B functions to emit light by recombining (i) holes (positive holes) injected from the first electrode 21 side with (ii) electrons injected from a second electrode 26 side. The luminescent layers 23R, 23G, and 23B are each made from a material with high luminous efficiency, such as a low-molecular fluorescent dye or a metal complex.

The electron transfer layer 24 functions to increase efficiency in transferring electrons from the second electrode to the luminescent layers 23R, 23G, and 23B. The electron injection layer 25 functions to increase efficiency in injecting electrons from the second electrode 26 into the electron transfer layer 24.

The electron transfer layer 24 is so provided on the luminescent layers 23R, 23G, and 23B and the hole injection and transfer layer 22 uniformly throughout the entire display region of the TFT substrate 10 as to cover the luminescent layers 23R, 23G, and 23B and the hole injection and transfer layer 22. The electron injection layer 25 is so provided on the electron transfer layer 24 uniformly throughout the entire display region of the TFT substrate 10 as to cover the electron transfer layer 24.

The electron transfer layer 24 and the electron injection layer 25 can be provided either (i) as separate layers independent of each other as described above or (ii) integrally with each other. In other words, the organic EL display device 1 can include an electron transfer and injection layer instead of the electron transfer layer 24 and the electron injection layer 25.

The second electrode 26 is a layer which functions to inject electrons into the organic EL layer including the above organic layers. The second electrode 26 is so provided on the electron injection layer 25 uniformly throughout the entire display region of the TFT substrate 10 as to cover the electron injection layer 25.

The organic layers other than the luminescent layers 23R, 23G, and 23B are not essential for the organic EL layer, and may thus be included as appropriate in accordance with a required property of the organic EL elements 20. The organic EL layer may further include a carrier blocking layer according to need. The organic EL layer can, for example, additionally include, as a carrier blocking layer, a hole blocking layer between the luminescent layers 23R, 23G, and 23B and the electron transfer layer 24. The hole blocking layer prevents positive holes from transferring from the luminescent layers 23R, 23G, and 23B to the electron transfer layer 24, whereby luminous efficiency is improved.

The organic EL elements 20 can have, for example, any of the layered structures (1) through (8) below.

(1) first electrodes/luminescent layer/second electrode (2) first electrodes/hole transfer layer/luminescent layer/electron transfer layer/second electrode (3) first electrodes/hole transfer layer/luminescent layer/hole blocking layer (carrier blocking layer)/electron transfer layer/second electrode (4) first electrodes/hole transfer layer/luminescent layer/hole blocking layer/electron transfer layer/electron injection layer/second electrode (5) first electrodes/hole injection layer/hole transfer layer/luminescent layer/electron transfer layer/electron injection layer/second electrode (6) first electrodes/hole injection layer/hole transfer layer/luminescent layer/hole blocking layer/electron transfer layer/second electrode (7) first electrodes/hole injection layer/hole transfer layer/luminescent layer/hole blocking layer/electron transfer layer/electron injection layer/second electrode (8) first electrodes/hole injection layer/hole transfer layer/electron blocking layer (carrier blocking layer)/luminescent layer/hole blocking layer/electron transfer layer/electron injection layer/second electrode As described above, the hole injection layer and the hole transfer layer, for example, can be integrated with each other. The electron transfer layer and the electron injection layer can also be integrated with each other.

The configuration of the organic EL elements 20 is not limited to the above example layered structure, and can have a desired layered structure in accordance with a required property of the organic EL elements 20 as described above.

The description below deals with a method for producing the organic EL display device 1.

FIG. 9 is a flowchart indicating successive steps for producing the organic EL display device 1.

As illustrated in FIG. 9, the method of the present embodiment for producing the organic EL display device 1 includes steps such as a TFT substrate and first electrodes preparing step (S1), a hole injection and transfer layer vapor deposition step (S2), a luminescent layer vapor deposition step (S3), an electron transfer layer vapor deposition step (S4), an electron injection layer vapor deposition step (S5), a second electrode vapor deposition step (S6), and a sealing step (S7).

The following describes, with reference to the flowchart illustrated in FIG. 9, the individual steps described above with reference to FIGS. 6 and 8.

Note, however, that the dimensions, materials, shapes and the like of respective constituent elements described in the present embodiment merely serve as an embodiment, and that the scope of the present invention should not be construed limitedly on the grounds of such aspects of the constituent elements.

The stack order described in the present embodiment, as mentioned above, intends to use (i) the first electrodes 21 as an anode and (ii) the second electrode 26 as a cathode. In a converse case where the first electrodes 21 serve as a cathode and the second electrode 26 serves as an anode, the stack order of the organic EL layer is reversed, and the respective materials of the first electrodes 21 and the second electrode 26 are switched similarly.

First, as illustrated in FIG. 8, the method of the present embodiment (i) applies a photosensitive resin onto an insulating substrate 11 made of a material such as glass, on which insulating substrate 11, for example, TFTs 12 and wires 14 are formed by a publicly known technique, and (ii) carries out patterning with respect to the photosensitive resin by photolithography. This forms an interlayer film 13 on the insulating substrate 11.

The insulating substrate 11 is, for example, a glass or plastic substrate having (i) a thickness of 0.7 mm to 1.1 mm, (ii) a length (longitudinal length) of 400 mm to 500 mm along a y axis direction, and (iii) a length (lateral length) of 300 mm to 400 mm along an x axis direction. The insulating substrate 11 of the present embodiment was a glass substrate.

The interlayer film 13 can be made from, for example, an acrylic resin or a polyimide resin. The acrylic resin is, for example, a product in the Optomer series available from JSR Corporation. The polyimide resin is, for example, a product in the Photoneece series available from Toray Industries, Inc. Note that since a typical polyimide resin is not transparent but colored, the interlayer film 13 is more suitably made from a transparent resin such as an acrylic resin in the case where an organic EL display device of the bottom emission type is produced as the organic EL display device 1 as illustrated in FIG. 8.

The interlayer film 13 is simply required to have a film thickness that can compensate for the difference in level created by the TFTs 12. The film thickness is thus not particularly limited. The film thickness was, for example, approximately 2 μm in the present embodiment.

The method of the present embodiment next forms, in the interlayer film 13, contact holes 13a for electrically connecting first electrodes 21 to the respective TFTs 12.

The method then forms, as a conductive film (electrode film), a film such as an ITO (indium tin oxide) film by a method such as a sputtering method so that the film has a thickness of 100 nm.

The method next applies a photoresist onto the ITO film, carries out patterning with respect to the photoresist by photolithography, and then carries out etching with respect to the ITO film with use of ferric chloride as an etchant. The method then strips the photoresist with use of a resist exfoliative solution, and further washes the insulating substrate 11. This forms the first electrodes 21 in a matrix manner on the interlayer film 13.

A conductive film material for the first electrodes 21 is, for example, (i) a transparent conductive material such as ITO, IZO (indium zinc oxide), or gallium-added zinc oxide (GZO) or (ii) a metal material such as gold (Au), nickel (Ni), or platinum (Pt).

The above conductive film can be formed by, instead of the sputtering method, a method such as a vacuum vapor deposition method, a chemical vapor deposition (CVD) method, a plasma CVD method, and a printing method.

A thickness of the first electrodes 21 is not particularly limited. The first electrodes 21 each can have a thickness of, for example, 100 nm as mentioned above.

The method next forms patterns of edge covers 15, as with the interlayer film 13, so that the edge covers 15 have a film thickness of, for example, approximately 1 μm. The edge covers 15 can be made from an insulating material similar to that for the interlayer film 13.

The step described above prepares the TFT substrate 10 and the first electrodes 21 (S1).

The method of the present embodiment next carries out, with respect to the TFT substrate 10 prepared through the above step, (i) a bake under a reduced pressure for dehydration and (ii) an oxygen plasma treatment for surface washing of the first electrodes 21.

The method then carries out vapor deposition of a hole injection layer and a hole transfer layer (in the present embodiment, a hole injection and transfer layer 22) on the TFT substrate 10 throughout the entire display region of the TFT substrate 10 with use of a conventional vapor deposition device (S2).

Specifically, the method (i) carries out an alignment adjustment, relative to the TFT substrate 10, of an open mask having an opening corresponding to the entire display region and (ii) closely attaches the open mask to the TFT substrate 10. The method then, while rotating the TFT substrate 10 and the open mask together, carries out, through the opening of the open mask and uniformly throughout the entire display region, vapor deposition of vapor deposition particles scattered from a vapor deposition source.

The above vapor deposition carried out throughout the entire display region refers to vapor deposition carried out unintermittently over sub-pixels which (i) has different colors and (ii) are located adjacent to one another.

The hole injection layer and the hole transfer layer are each made from a material such as (i) benzine, styryl amine, triphenylamine, porphyrin, triazole, imidazole, oxadiazole, polyarylalkane, phenylenediamine, arylamine, oxazole, anthracene, fluorenone, hydrazone, stilbene, triphenylene, azatriphenylene, or a derivative of any of the above or (ii) a monomer, an oligomer, or a polymer of an open chain conjugated system of a compound such as a polysilane compound, a vinylcarbazole compound, a thiophene compound or an aniline compound.

The hole injection layer and the hole transfer layer can be either integrated with each other as described above or formed as separate layers independent of each other. The hole injection layer and the hole transfer layer each have a film thickness of, for example, 10 nm to 100 nm.

The present embodiment used, as the hole injection layer and the hole transfer layer, the hole injection and transfer layer 22 which (i) was made from 4,4'-bis[N-(1-naphthyl)-N-phenylamino]biphenyl(α-NPD) and (ii) had a film thickness of 30 nm.

The method of the present embodiment next carries out a selective application formation (pattern formation) of luminescent layers 23R, 23G, and 23B on the hole injection and transfer layer 22 in correspondence with the respective sub-pixels 2R, 2G, and 2B so that the luminescent layers 23R, 23G, and 23B cover respective openings 15R, 15G, and 15B of the edge covers 15 (S3).

As described above, the luminescent layers 23R, 23G, and 23B are each made from a material with high luminous efficiency, such as a low-molecular fluorescent dye or a metal complex.

The luminescent layers 23R, 23G, and 23B are each made of a material such as (i) anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, or a derivative of any of the above, (ii) a tris(8-hydroxyquinolinate) aluminum complex, (iii) a bis(benzohydroxyquinolinate) beryllium complex, (iv) a tri (dibenzoylmethyl) phenanthroline europium complex, or (v) ditoluoyl vinyl biphenyl.

The luminescent layers 23R, 23G, and 23B each have a film thickness of, for example, 10 nm to 100 nm.

The vapor deposition method and the vapor deposition device of the present embodiment are each particularly suitably used for the selective application formation (pattern formation) of such luminescent layers 23R, 23G, and 23B.

A description below deals in detail with the selective application formation of the luminescent layers 23R, 23G, and 23B, which selective application formation involves the vapor deposition method and the vapor deposition device of the present embodiment.

The method of the present embodiment next carries out, in a manner similar to that described for the above hole injection and transfer layer vapor deposition step (S2), vapor deposition of an electron transfer layer 24 throughout the entire display region of the TFT substrate 10 so that the electron transfer layer 24 covers the hole injection and transfer layer 22 and the luminescent layers 23R, 23G, and 23B (S4).

The method then carries out, in a manner similar to that described for the above hole injection and transfer layer vapor deposition step (S2), vapor deposition of an electron injection layer 25 throughout the entire display region of the TFT substrate 10 so that the electron injection layer 25 covers the electron transfer layer 24 (S5).

The electron transfer layer 24 and the electron injection layer 25 are each made from a material such as a tris(8-hydroxyquinolinate) aluminum complex, an oxadiazole derivative, a triazole derivative, a phenylquinoxaline derivative, and/or a silole derivative.

Specific examples of the material include (i) Alq(tris(8-hydroxy quinoline)aluminum), anthracene, naphthalene, phenanthrene, pyrene, anthracene, perylene, butadiene, coumarin, acridine, stilbene, 1,10-phenanthroline, and a derivative or a metal complex of any of the above, and (ii) LiF.

As mentioned above, the electron transfer layer 24 and the electron injection layer 25 can be either integrated with each other or formed as separate layers independent of each other. The electron transfer layer 24 and the electron injection layer 25 each have a film thickness of, for example, 1 nm to 100 nm. The respective film thicknesses of the electron transfer layer 24 and the electron injection layer 25 add up to, for example, 20 nm to 200 nm.

In the present embodiment, (i) the electron transfer layer 24 was made from Alq, whereas the electron injection layer 25 was made from LiF, and (ii) the electron transfer layer 24 had a film thickness of 30 nm, whereas the electron injection layer 25 had a film thickness of 1 nm.

The method of the present embodiment next carries out, in a manner similar to that described for the above hole injection and transfer layer vapor deposition step (S2), vapor deposition of a second electrode 26 throughout the entire display region of the TFT substrate 10 so that the second electrode 26 covers the electron injection layer 25 (S6).

The second electrode 26 is suitably made of a material (electrode material) such as a metal with a small work function. Examples of such an electrode material include a magnesium alloy (for example, MgAg), an aluminum alloy (for example, AlLi, AlCa, or AlMg), and calcium metal. The second electrode 26 has a thickness of, for example, 50 nm to 100 nm.

In the present embodiment, the second electrode 26 was made of aluminum, and had a film thickness of 50 nm. The operation described above forms, on the TFT substrate 10, organic EL elements 20 including an organic EL layer, the respective first electrodes 21, and the second electrode 26 which hare described above.

The method of the present embodiment then attached the TFT substrate 10, on which the organic EL elements 20 are provided, to a sealing substrate 40 with use of an adhesive layer 30, as illustrated in FIG. 6, so that the organic EL elements 20 were sealed.

The sealing substrate 40 is, for example, an insulating substrate, such as a glass substrate or a plastic substrate, which has a thickness of 0.4 mm to 1.1 mm. The sealing substrate 40 of the present embodiment was a glass substrate.

Longitudinal and lateral lengths of the sealing substrate 40 can each be adjusted as appropriate in accordance with a size of an organic EL display device 1 to be obtained. The sealing substrate 40 can be an insulating substrate substantially equal in size to the insulating substrate 11 of the TFT substrate 10, in which case a combination of the sealing substrate 40, the TFT substrate 10, and the organic EL elements 20 that are contained therebetween is divided in accordance with the size of the organic EL display device 1 to be obtained.

A method for sealing the organic EL elements 20 is not limited to the above-described method. Examples of other sealing methods include (i) a method that uses a centrally depressed glass substrate as the sealing substrate 40 and that seals the combination of the sealing substrate 40 and the TFT substrate 10 along the edge in a frame shape with use of, for example, a sealing resin or fritted glass and (ii) a method that fills a space between the TFT substrate 10 and the sealing substrate 40 with a resin. The method for producing the organic EL display device 1 does not depend on the above sealing method, and can employ any of various sealing methods.

The second electrode 26 can be provided thereon with a protective film (not illustrated) that covers the second electrode 26 so as to prevent oxygen and moisture from entering the organic EL elements 20 from an outside.

The protective film is made from an electrically insulating or conductive material such as silicon nitride or silicon oxide. The protective film has a thickness of, for example, 100 nm to 1000 nm.

Through the above steps, the organic EL display device 1 is finally produced.

The organic EL display device 1, upon receipt of a signal through a wire 14, turns on a corresponding TFT 12 and thus allows (i) positive holes to be injected from a corresponding first electrode 21 into the organic EL layer and (ii) electrons to be injected from the second electrode 26 into the organic EL layer. This causes the positive holes and the electrons to recombine with each other inside a corresponding one of the luminescent layers 23R, 23G, and 23B. The positive holes and the electrons thus recombined are emitted in the form of light when becoming inactive.

The above organic EL display device 1 displays a predetermined image by controlling respective light emission luminances of the sub-pixels 2R, 2G, and 2B.

The following describes an arrangement of a vapor deposition device of the present embodiment.

Figure 1:
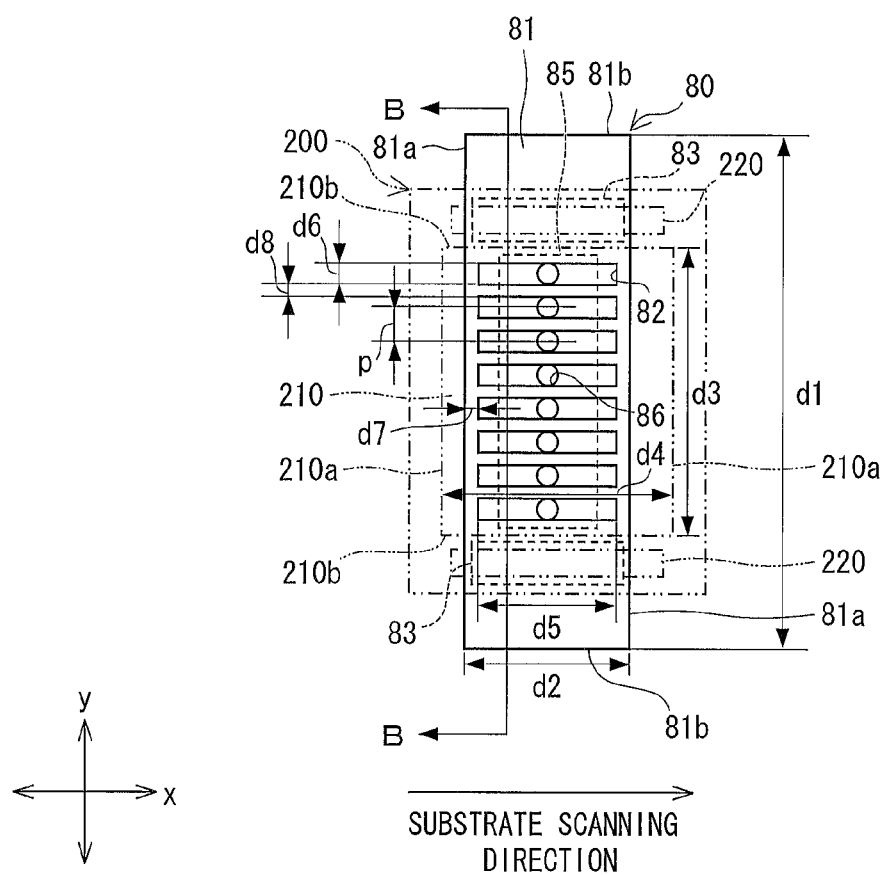
FIG. 1 is a plan view illustrating a film formation substrate and a mask unit, inside a vacuum chamber, of a vapor deposition device according to Embodiment 1 of the present invention, as viewed from a back surface side of the film formation substrate.
Figure 2:
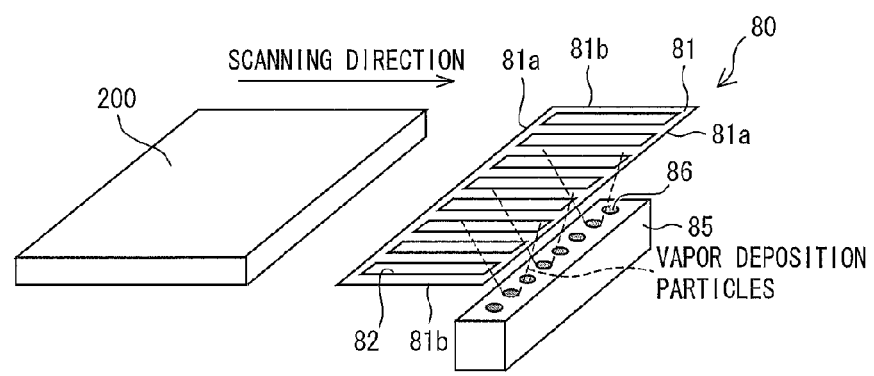
FIG. 2 is a bird's-eye view illustrating main constituent elements, inside the vacuum chamber, of the vapor deposition device according to Embodiment 1 of the present invention.
Figure 3:
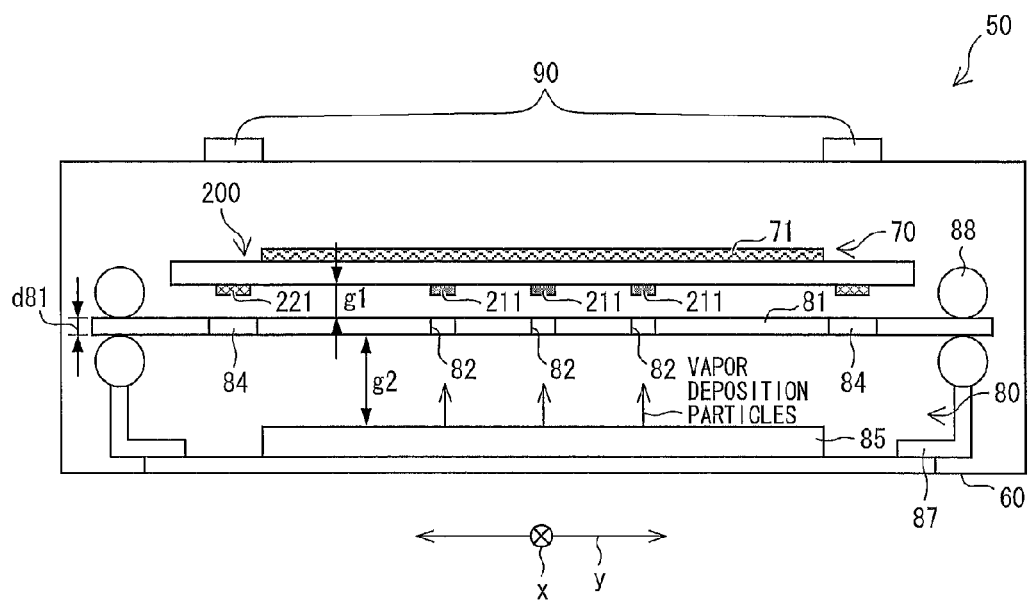
FIG. 3 is a cross-sectional view schematically illustrating a configuration of a main part of the vapor deposition device according to Embodiment 1 of the present invention.
Figure 4:
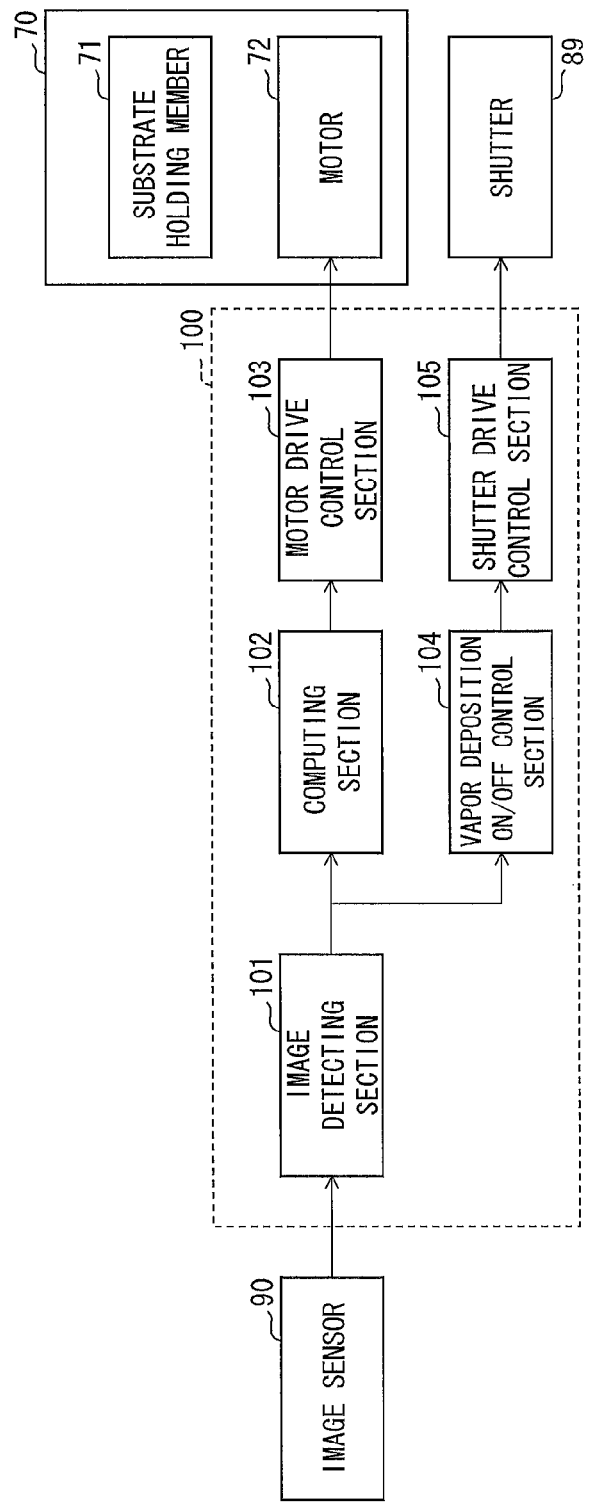
FIG. 4 is a block diagram partially illustrating the configuration of the vapor deposition device according to Embodiment 1 of the present invention.

FIG. 1 is a plan view of a film formation substrate and a mask unit both inside a vacuum chamber of the vapor deposition device of the present embodiment, the plan view being taken from a back surface side of the film formation substrate (that is, a side opposite to a vapor-deposited surface). For convenience of illustration, FIG. 1 uses a chain double-dashed line to represent the film formation substrate. FIG. 2 is a bird's eye view of main constituent elements inside the vacuum chamber of the vapor deposition device of the present embodiment. FIG. 3 is a cross-sectional view schematically illustrating a configuration of a main part of the vapor deposition device of the present embodiment. FIG. 3 illustrates a cross section of the vapor deposition device, the cross section being taken along line B-B of FIG. 1. FIG. 4 is a block diagram illustrating a part of a configuration of the vapor deposition device of the present embodiment.

The vapor deposition device 50 of the present embodiment, as illustrated in FIG. 3, includes: a vacuum chamber 60 (film growing chamber); a substrate moving mechanism 70 (substrate moving means; moving means); a mask unit 80; image sensor(s) 90; and a control circuit 100 (see FIG. 4).

As illustrated in FIG. 3, the vacuum chamber 60 includes the substrate moving mechanism 70 and the mask unit 80.

The vacuum chamber 60 is provided with a vacuum pump (not illustrated) for vacuum-pumping the vacuum chamber 60 via an exhaust port (not illustrated) of the vacuum chamber 60 so as to keep a vacuum in the vacuum chamber 60 during vapor deposition.

The substrate moving mechanism 70 includes: a substrate holding member 71 (substrate holding means) for holding a film formation substrate 200 (for example, the TFT substrate 10); and a motor 72 (see FIG. 4).

The substrate moving mechanism 70 causes (i) the substrate holding member 71 to hold the film formation substrate 200 and (ii) a below-described motor drive control section 103 (see FIG. 4) to drive the motor 72 so as to (i) hold the film formation substrate 200 and (ii) move the film formation substrate 200 in the horizontal direction. The substrate moving mechanism 70 can be provided to be capable of moving the film formation substrate 200 either (i) in both an x axis direction and a y axis direction or (ii) in one of the x axis direction and the y axis direction.

Note that the x axis direction is a direction along a direction in which a substrate is scanned (such a direction is referred to as a substrate scanning direction, see FIG. 1), and the y axis direction is a direction orthogonal to the substrate scanning direction (hereinafter referred to as an orthogonal-to-scan direction).

The substrate holding member 71 is an electrostatic chuck. The film formation substrate 200 is, in a state in which bend due to its own weight is absent, so held by the electrostatic chuck as to be separated from a shadow mask 81 (later described) of the mask unit 80 by a predetermined gap g1 (void; vertical distance).

The predetermined gap g1, as illustrated in (a) of FIG. 14, is fixed so that each of the luminescent layers 23R, 23G, and 23B will have inclined side surfaces 23s in opposite parts, along the orthogonal-to-scan direction (predetermined direction), of the each of the luminescent layers 23R, 23G, and 23B, the inclined side surfaces 23s being gently inclined with respect to a direction normal to the film formation substrate 200 (Note that FIG. 14 illustrates only the luminescent layer 23R for convenience of illustration. However, the same applies to the luminescent layers 23G and 23B.). That is, the present embodiment is arranged such that, in consideration of a certain spreading of vapor deposition particles injected from a vapor deposition source 85, the gap g1 is adjusted to a predetermined distance so that gently inclined side surfaces 23s will be obtained.

In a case of the predetermined gap g1, a gradient an inclined side surface 23s is set as illustrated in FIG. 15. That is, a gradient H/B of the inclined side surface 23s is set so that the absolute value of the gradient H/B is not more than 1/200, where (i) B is a width, in the orthogonal-to-scan direction (y axis direction), of the inclined side surface 23s and (ii) H is a maximum thickness of a flat part 23t (part other than inclined side surfaces 23s) of a luminescent layer 23R, 23B or 23G. Note that FIG. 15 illustrates a case where the gradient is H/B throughout the inclined side surface 23s. That is, H/B represents an upper limit of the gradient that the inclined side surface 23s can have. The upper limit of the gradient H/B is 1/200, when H is 500 Å (MAX) and B is 10 µm.

Note that there is no specific lower limit of the gradient of the inclined side surface 23s. However, in reality, a lower limit of an average gradient is determined, for example, by H/C where C is a width, in the orthogonal-to-scan direction (y axis direction), of a non-luminescent region (non-vapor deposition region) 29 (see FIG. 14) between a luminescent region (e.g., 24R) and an adjacent luminescent region (e.g., 24G). In a case where the gradient exceeds the lower limit H/C of the average gradient, a vapor-deposited film is necessarily formed in an adjacent luminescent region.

Note that the width B is set to be, for example, smaller than the width C(C is 20 µm in the present embodiment) of the non-luminescent region 29. More specifically, in the present embodiment, the width B is set to be larger than a half of the width C but smaller than the width C (for example, the width B is set to 15 µm).

The gap g1 between the film formation substrate 200 and the shadow mask 81 preferably falls within a range of not less than 50 µm and not more than 3 mm, and is more preferably on the order of 200 µm.

If the gap g1 is larger than 3 mm, vapor deposition particles that have passed through openings 82 of the shadow mask 81 are spread widely. This results in a vapor-deposited film 211 being formed to have too large a pattern width. In a case where, for example, the vapor-deposited film 211 is the luminescent layer 23R, the gap g1 being larger than 3 mm may undesirably result in vapor deposition of a material for the luminescent layer 23R through openings 15G and 15B of the respective sub-pixels 2G and 2B adjacent to the sub-pixel R.

With the gap g1 being approximately 200 µm, (i) there is no risk of the film formation substrate 200 coming into contact with the shadow mask 81, and (ii) the vapor-deposited film 211 can have a sufficiently small pattern width.

The mask unit 80, as illustrated in FIG. 3, includes: the shadow mask 81 (vapor deposition mask); the vapor deposition source 85; a mask holding member 87 (holding means); a mask tension mechanism 88; and a shutter 89 (see FIG. 4).

The shadow mask 81 is, for example, a metal mask.

The shadow mask 81 is so formed as to (i) be smaller in area than a display region 210 of the film formation substrate 200 and (ii) have at least one side that is shorter than a width of the display region 210 of the film formation substrate 200.

The shadow mask 81 of the present embodiment has a rectangular shape (that is, in a shape of a belt), and is sized as follows: The shadow mask 81 is, as illustrated in FIG. 1, so formed as to have (i) long sides 81a each with a width d1 (that is, a length along a long-side direction (long-axis direction) of the shadow mask 81) that is larger than a width d3 of a side of the display region 210, which side faces the long sides 81a of the shadow mask 81 (in FIG. 1, the side is a long side 210a of the display region 210) and (ii) short sides 81b each with a width d2 (that is, a length along a lateral direction [short-axis direction] of the shadow mask 81) that is smaller than a width d4 of a side of the display region 210, which side faces the short sides 81b of the shadow mask 81 (in FIG. 1, the side is a short side 210b of the display region 210).

The shadow mask 81, as illustrated in FIGS. 1 and 2, has a plurality of openings 82 (through holes) (i) which are arranged in a one-dimensional direction and (ii) each of which has a shape of, for example, a belt (that is, in a stripe shape). In the case where, for example, a selective application formation of the luminescent layers 23R, 23G, and 23B is carried out with respect to the TFT substrate 10 as a pattern formation of vapor-deposited films 211 (see FIG. 3) on the film formation substrate 200, the openings 82 are formed in correspondence with the size and pitch of columns of each color of the luminescent layers 23R, 23G, and 23B.

That is, the openings 82 are formed so that their widths in the orthogonal-to-scan direction (y axis direction) are equal to those, in the orthogonal-to-scan direction, of the luminescent regions 24R, 24G, and 24B, respectively, where the respective luminescent layers 23R, 23G, and 23B are formed. Therefore, according to the present embodiment, a width, in the orthogonal-to-scan direction, of a flat part 23t (part other than the inclined side surfaces 23s) of each of the luminescent layers 23R, 23G, and 23B is equal to that, in the orthogonal-to-scan direction, of a corresponding one of the luminescent regions 24R, 24G, and 24B (see FIG. 14).

The shadow mask 81, as illustrated in FIG. 1, includes, for example, alignment marker sections 83 extending along a scanning direction (substrate scanning direction) of the film formation substrate 200. Each of the alignment marker sections 83 includes alignment markers 84 (see FIG. 3) for use in an alignment between the film formation substrate 200 and the shadow mask 81.

According to the present embodiment, the alignment marker sections 83 are, as illustrated in FIG. 1, provided along the short sides 81b (short axis) of the shadow mask 81.

The shadow mask 81, as described above, has (i) the long sides 81a each with the width d1 that is larger than the width d3 of the side of the display region 210, which side faces the long sides 81a and (ii) the short sides 81b each with the width d2 that is smaller than the width d4 of the side of the display region 210, which side faces the short sides 81b. This arrangement allows the alignment marker sections 83 to be formed respectively in opposite end sections arranged along the long-side direction (that is, at the opposite short sides 81b). The above arrangement thus makes it possible to carry out an alignment easily and more precisely.

As illustrated in FIG. 1, the film formation substrate 200 is provided with alignment marker sections 220 (i) outside the display region 210 and (ii) along the scanning direction (substrate scanning direction) of the film formation substrate 200. Each of the alignment marker sections 220 includes alignment markers 221 (see FIG. 3) for use in an alignment between the film formation substrate 200 and the shadow mask 81.

According to the present embodiment, the alignment marker sections 220 are, as illustrated in FIG. 1, provided along respective short sides 210b (short axis) of the display region 210 of the film formation substrate 200.

Note that with use of the alignment markers 84 and 221, the film formation substrate 200 and the shadow mask 81 are positioned relative to each other so that a center of a width, in the orthogonal-to-scan direction (y axis direction), of the each of the luminescent layers 23R, 23G, and 23B is substantially equal to that of the width, in the orthogonal-to-scan direction, of the corresponding one of the luminescent regions 24R, 24G, and 24B (described later (that is, as illustrated in FIG. 14)).

According to the present embodiment, the openings 82 each in the stripe shape are provided so as to (i) extend along the lateral direction of the shadow mask 81, that is, the substrate scanning direction and (ii) be arranged next to one another along the long-side direction of the shadow mask 81, that is, a direction that orthogonally crosses the substrate scanning direction.

The vapor deposition source 85 is, for example, a container that contains a vapor deposition material. The vapor deposition source 85 is, as illustrated in FIGS. 1 through 3, (i) placed so as to face the shadow mask 81 and (ii) separated from the shadow mask 81 by a fixed gap g2 (void), (that is, positioned away from the shadow mask 81 by a fixed distance).

The vapor deposition source 85 can be a container that directly contains a vapor deposition material or a container that includes a load-lock pipe.

The vapor deposition source 85 includes, for example, a mechanism for injecting vapor deposition particles upward.

The vapor deposition source 85 has, on a surface facing the shadow mask 81, a plurality of injection holes 86 from which the vapor deposition material in the form of vapor deposition particles is to be emitted (scattered).

As illustrated in FIG. 16, an injection hole (that is, a nozzle opening) 86 is in a rectangular shape which has a pair of opposite sides extending along the orthogonal-to-scan direction (y axis direction) so that inclined side surfaces 23s of a luminescent layers 23R, 23G or 23B become flat.

Specifically, as illustrated in FIG. 17, consider vapor deposition particles which reach a position A and a position B on the display region 210 from the vapor deposition source 85. The incident angle αA of a vapor deposition particle which strikes the position A and the incident angle αB of a vapor deposition particle which strikes the position B are restricted by the shadow mask 81. Therefore, only vapor deposition particles injected from the vapor deposition source 85 so as to strike the position A with an incident angle of not smaller than αA reach the position A, and only vapor deposition particles injected from the vapor deposition source 85 so as to strike the position B with an incident angle of not smaller than αB reach the position B. That is, in FIG. 17, only vapor deposition particles injected from a region on the left side of a position A' of the vapor deposition source 85 which region includes the position A' reach the position A, and only vapor deposition particles injected from a region on the left side of a position B' of the vapor deposition source 85 which region includes the position B' reach the position B.

As such, in a case where, as illustrated in (a) of FIG. 16, (i) an injection hole 86 of the vapor deposition source 85 is in a rectangular shape and (ii) the positions A' and B' are located on the injection hole 86 as shown in (a) of FIG. 16 (that is, in a case where the positions A' and B' are located so that each of them linearly extends along a nozzle opening length 86x and the positions A' and B' are arranged along a nozzle opening width 86y (that is, along the orthogonal-to-scan direction (y axis direction))), $N_A$ is an effective region of the injection hole 86 from which vapor deposition particles, which can contribute to formation of a luminescent layer (such as the luminescent layer 23R) at the position A, are injected. Only vapor deposition particles injected from the effective region $N_A$ reach the position A. Similarly, only vapor deposition particles injected from an effective region $N_B$ reach the position B.

Note here that the nozzle opening length 86x is constant throughout the injection hole 86. Therefore, from the position A to the position B, the area of a corresponding effective region linearly decreases. Therefore, the thickness of a corresponding luminescent layer 23R, 23G or 23B in a region 210s of the display region 210, in which region 210s an incident angle is restricted by the shadow mask 81, monotonically decreases from an end 210s1 on a position B side to an end 210s2 on a position A side (see FIG. 17). Such a part having a linearly decreasing thickness corresponds to an inclined side surface 23s. As such, when the injection hole 86 of the vapor deposition source 85 has a rectangular shape, an obtained inclined side surface 23s has a flat inclined surface.

According to the present embodiment, the inclined side surface 23s is a flat inclined side surface (that is, the outline of the inclined side surface 23s is a straight line). Note, however, that the inclined side surface 23 can be a curved inclined side surface (that is, the outline of the inclined side surface 23 can be a curve). For example, as illustrated in (b) of FIG. 16, in a case where an injection hole 86 has a rectangular shape with four inwardly rounded corners, a nozzle opening width 86y in each of the effective regions $N_A$ and $N_B$ is not constant. Therefore, the area of each of the effective regions $N_A$ and $N_B$ does not decrease linearly from the position A to the position B (In this case, the area decreases in a manner corresponding to the shape of the inwardly rounded corners). As such, the inclined side surface 23s is curved.

As is clear from above, it is possible to make an inclined side surface 23s with a desired inclination by setting the shape of a corresponding injection hole 86 as appropriate. Note that the inclined side surface 23s with a desired inclination can be formed by a method other than the above-described method.

According to the present embodiment, as described above, (i) the vapor deposition source 85 is provided below the film formation substrate 200 and (ii) the film formation substrate 200 is held by the substrate holding member 71 in such a state that the display region 210 faces downward. Thus, in the present embodiment, the vapor deposition source 85 carries out vapor deposition of vapor deposition particles through the openings 82 of the shadow mask 81 onto the film formation substrate 200 upward from below (that is, up deposition; hereinafter referred to as "depo-up").

The injection holes 86 are, as illustrated in FIGS. 1 and 2, provided to face the respective openings 82 of the shadow mask 81 so as to be open in respective opening regions of the shadow mask 81. The injection holes 86 of the present embodiment are arranged one-dimensionally (i) along a direction in which the openings 82 of the shadow mask 81 are arranged next to one another and (ii) so as to face the respective openings 82 of the shadow mask 81.

Thus, as illustrated in FIGS. 1 and 2, the vapor deposition source 85 is formed to have a surface that faces the shadow mask 81, the surface (that is, the surface in which the injection holes 86 are formed) having, for example, a rectangular shape (belt shape) as viewed from a back surface side of the film formation substrate 200 (that is, in a plan view) so as to match a rectangular shape (belt shape) of the shadow mask 81.

In the mask unit 80, the shadow mask 81 and the vapor deposition source 85 are fixed in position relative to each other. Specifically, there is constantly a fixed gap g2 between (i) the shadow mask 81 and (ii) the surface of the vapor deposition source 85 in which surface the injection holes 86 are formed, and there is constantly a fixed positional relationship between (i) the openings 82 of the shadow mask 81 and (ii) the injection holes 86 of the vapor deposition source 85.

The injection holes 86 of the vapor deposition source 85 are each so placed as to coincide with a center of a corresponding opening 82 of the shadow mask 81 when the mask unit 80 is viewed from the back surface side of the film formation substrate 200 (that is, in a plan view).

The shadow mask 81 and the vapor deposition source 85 are, for example, attached to the mask holding member 87 (for example, an identical holder) for holding and fixing (i) the shadow mask 81 via the mask tension mechanism 88 and (ii) the vapor deposition source 85 (see FIG. 3). The shadow mask 81 and the vapor deposition source 85 are thus so integrated with each other as to be held and fixed in the respective positions relative to each other.

The shadow mask 81 is under tension caused by the mask tension mechanism 88. The shadow mask 81 is thus adjusted as appropriate so that no bend or elongation due to its own weight is caused.

The vapor deposition device 50 is arranged as described above such that (i) the film formation substrate 200 is adhered to a fixing plate by the substrate holding member 71 (electrostatic chuck), and is thus prevented from being bent due to its own weight and (ii) the shadow mask 81 is under tension caused by the mask tension mechanism 88 so that a distance between the film formation substrate 200 and the shadow mask 81 is uniformly maintained throughout the entire region over which the film formation substrate 200 overlaps the shadow mask 81 in a plan view.

The shutter 89 is used according to need in order to control reaching of vapor deposition particles to the shadow mask 81. The shutter 89 is either closed or opened by a shutter drive control section 105 (see FIG. 4) in accordance with a vapor deposition OFF signal or a vapor deposition ON signal from a vapor deposition ON/OFF control section 104 (see FIG. 4) described below.

The shutter 89 is, for example, provided so as to be moved (so as to be inserted) in between or so as to be away from the shadow mask 81 and the vapor deposition source 85. The shutter 89 is inserted between the shadow mask 81 and the vapor deposition source 85 to close the openings 82 of the shadow mask 81. Appropriately inserting the shutter 89 between the shadow mask 81 and the vapor deposition source 85 can prevent vapor deposition on a portion for which vapor deposition is unnecessary (that is, a non-vapor deposition region).

The vapor deposition device 50 is so adjusted that vapor deposition particles outputted from the vapor deposition source 85 are scattered below the shadow mask 81. The vapor deposition device 50 can be arranged such that vapor deposition particles scattered beyond the shadow mask 81 are blocked as appropriate by, for example, a deposition preventing plate (shielding plate).

Image sensor(s) 90 (see FIG. 4) each of which includes, for example, a CCD and serves as image sensing means (image reading means) are provided outside of the vacuum chamber 60. Further, the control circuit 100 serving as control means is provided outside of the vacuum chamber 60 so as to be connected to the image sensor(s) 90.

The image sensor(s) 90 each function as position detecting means for use in an alignment of the film formation substrate 200 and the shadow mask 81 so that centers of widths, in the orthogonal-to-scan direction (y axis direction), of the openings 82 of the shadow mask 81 align with those of widths, in the orthogonal-to-scan direction, of the luminescent regions 24R, 24G, and 24B of the film formation substrate 200.

The control circuit 100 includes an image detecting section 101, a computing section 102, a motor drive control section 103, a vapor deposition ON/OFF control section 104, and a shutter drive control section 105.

As described above, the film formation substrate 200 is provided with alignment marker sections 220 (i) outside the display region 210 and (ii) along, for example, the substrate scanning direction, the alignment marker sections 220 each including the alignment markers 221 (see FIG. 1).

The image detecting section 101 detects, from an image captured by the image sensor 90, (i) images of the alignment markers 221 of the film formation substrate 200 and (ii) images of the alignment markers 84 of the shadow mask 81. The image detecting section 101 further detects a start-end and a rear-end of the display region 210 of the film formation substrate 200 from (i) a start-end marker of the alignment markers 221, which start-end marker is indicative of the start-end of the display region 210 and (ii) a rear-end marker of the alignment markers 221, which rear-end marker is indicative of the rear-end of the display region 210.

The start-end marker and the rear-end marker may be identical to each other. In this case, the image detecting section 101 determines, with respect to the substrate scanning direction, whether a particular end of the display region 210 is its start-end or rear-end.

The computing section 102 determines, on the basis of the images which have been detected by the image detecting section 101, a relative movement amount of the film formation substrate 200 and the shadow mask 81 (for example, an amount of movement of the film formation substrate 200 relative to the shadow mask 81). The computing section 102, for example, measures an amount of positional difference (that is, a shift component along the x axis direction and the y axis direction, and a rotation component on an x-y plane) between the alignment markers 221 and the alignment markers 84 to determine, by computation, a correction value for a substrate position of the film formation substrate 200. In other words, the computing section 102 determines the correction value by computation with respect to (i) a direction perpendicular to the substrate scanning direction and (ii) a rotation direction of the film formation substrate 200.

The rotation direction of the film formation substrate refers to a direction of rotation on the x-y plane about a z axis (that is, an axis orthogonal to both the x axis and the y axis) which serves as a rotation axis at the center of a film formation surface of the film formation substrate 200.

The correction value is supplied in the form of a correction signal to the motor drive control section 103. The motor drive control section 103, on the basis of the correction signal from the computing section 102, drives the motor 72 connected to the substrate holding member 71, and thus corrects the substrate position of the film formation substrate 200.

How the substrate position is corrected with use of the alignment markers 84 and 221 is described below together with example shapes of the alignment markers 84 and 221.

The motor drive control section 103 drives the motor 72 to move the film formation substrate 200 in the horizontal direction (x axis direction) as mentioned above, while the centers of the widths, in the orthogonal-to-scan direction (y axis direction), of the openings 82 of the shadow mask 81 are aligned with those of the widths, in the orthogonal-to-scan direction, of the luminescent regions 24R, 24G, and 24B.

The vapor deposition ON/OFF control section 104 generates (i) a vapor deposition OFF signal when the image detecting section 101 detects the rear-end of the display region 210 and (ii) a vapor deposition ON signal when the image detecting section 101 detects the start-end of the display region 210.

The shutter drive control section 105 (i) closes the shutter 89 upon receipt of the vapor deposition OFF signal from the vapor deposition ON/OFF control section 104 and (ii) opens the shutter 89 upon receipt of the vapor deposition ON signal from the vapor deposition ON/OFF control section 104.

The following describes (i) how the substrate position is corrected with use of the alignment markers 84 and 221 and (ii) example shapes of the alignment markers 84 and 221.

(a) through (c) of FIG. 5 illustrate example shapes of the alignment markers 84 and 221. Note that for convenience of illustration, each of (b) and (c) of FIG. 5 illustrates (i) merely two of the alignment markers 84 which are juxtaposed to each other and (ii) merely corresponding two of the alignment markers 221 which juxtaposed to each other.

The computing section 102, on the basis of an image of an alignment marker 84 and an alignment marker 221, the image having been detected by the image detecting section 101, measures (calculates) (i) a distance r, along the x axis direction, between an end (outer edge) of the alignment marker 84 and an end (outer edge) of the alignment marker 221 and (ii) a distance q, along the y axis direction, between an end (outer edge) of the alignment marker 84 and an end (outer edge) of the alignment marker 221. The computing section 102 thus calculates an amount of positional difference in alignment to compute a correction value for a substrate position.

In a case where, for example, the substrate scanning direction is the x axis direction, the sign "r" in (a) through (c) of FIG. 5 indicates a distance between the ends along the substrate scanning direction, whereas the sign "q" in (a) through (c) of FIG. 5 indicates a distance between the ends along the direction perpendicular to the substrate scanning direction. The computing section 102 measures (calculates) the distances r and q at, for example, opposite ends of the display region 210 of the film formation substrate 200 to determine the amount of positional difference in alignment during a substrate scanning.

The present embodiment describes an example case that involves simultaneously scanning the film formation substrate 200 and carrying out an alignment between the shadow mask 81 and the film formation substrate 200. The present embodiment is, however, not limited to the example case. The present embodiment can alternatively be arranged such that (i) a sufficient alignment is carried out before a substrate scanning and (ii) no alignment is carried out during the substrate scanning.

For example, the film formation substrate 200 is moved along a first side of the display region 210 of the film formation substrate 200 (for example, along the y axis direction in (a) through (c) of FIG. 5), and is then moved along a second side (for example, the x axis direction in (a) through (c) of FIG. 5) orthogonal to the first side. In this case, the sign "r" in (a) through (c) of FIG. 5 indicates a distance between the ends along the direction perpendicular to the substrate scanning direction, whereas the sign "q" in (a) through (c) of FIG. 5 indicates a distance between the ends along a direction (shift direction) in which the film formation substrate 200 is moved.

In this case, the computing section 102 measures distances r and q for each of alignment markers located at respective four corners, and thus determines (i) an amount of positional difference in alignment at the start of a substrate scanning and (ii) an amount of positional difference in alignment after the film formation substrate 200 is moved (shifted).

The alignment markers 84 and 221 can each be in a shape of, for example, (i) a belt, (ii) a quadrangle such as a square, (iii) a frame, or (iv) a cross (see (a) through (c) of FIG. 5). The alignment markers 84 and 221 are thus not particularly limited in terms of shape.

In a case, as described above, where a sufficient alignment is carried out before a substrate scanning and no alignment is carried out during the substrate scanning, the alignment markers 221 do not need to be provided along a side of the display region 210 of the film formation substrate 200, and may instead be provided at, for example, four corners of the film formation substrate 200.

The following describes in detail a method for forming a pattern of an organic EL layer by using the vapor deposition device 50 of the present embodiment as a device for producing the organic EL display device 1.

The description below deals with an example case that, as described above, involves (i) using, as the film formation substrate 200, a TFT substrate 10 which has been subjected to the hole injection and transfer layer vapor deposition step (S2) and (ii) carrying out, as a pattern formation of an organic EL layer, a selective application formation of luminescent layers 23R, 23G, and 23B during the luminescent layer vapor deposition step (S3).

The present embodiment assumed that (i) the gap g2 between the vapor deposition source 85 and the shadow mask 81 (that is, a distance between the shadow mask 81 and a surface of the vapor deposition source 85 in which surface the injection holes 86 are formed) is 100 mm and (ii) a distance between the TFT substrate 10 serving as the film formation substrate 200 and the shadow mask 81 is 200 μm.

The present embodiment further assumed that (i) the TFT substrate 10 has a size of 320 mm along the substrate scanning direction and 400 mm along the direction perpendicular to the substrate scanning direction and (ii) the display region has a width (width d4) of 260 mm along the substrate scanning direction and a width (width d3) of 310 mm along the direction perpendicular to the substrate scanning direction.

The present embodiment further assumed that a size of each of the openings 15R, 15G, and 15B for the respective sub-pixels 2R, 2G, and 2B on the TFT substrate 10 is 360 μm (along the substrate scanning direction)×140 μm (along the direction perpendicular to the substrate scanning direction). The present embodiment further assumed that a pitch among the openings 15R, 15G, and 15B is 480 μm (along the substrate scanning direction)×160 μm (along the direction perpendicular to the substrate scanning direction). The pitch among the openings 15R, 15G, and 15B (that is, a pitch between pixel openings) refers to a pitch between adjacent ones of the openings 15R, 15G, and 15B for corresponding adjacent ones of the sub-pixels 2R, 2G, and 2B, but does not refer to a pitch between sub-pixels of an identical color.

The present embodiment used, as the shadow mask 81, a shadow mask having (i) a long side 81a (along the long-axis direction) of 600 mm (width d1) (that is, a width along the direction perpendicular to the substrate scanning direction) and (ii) a short side 81b (along the short-axis direction) of 200 mm (width d2) (that is, a width along the substrate scanning direction). The shadow mask 81 had openings 82 (i) each of which has a size of 150 mm (width d5 along the long-axis direction; see FIG. 1)×140 μm (width d6 along the short-axis direction; see FIG. 1), (ii) any adjacent ones of which have an interval d8 (see FIG. 1) of 340 μm therebetween, and (iii) any adjacent ones of which have respective centers which are distant by 480 μm (pitch p) (see FIG. 1).

In the present embodiment, it is preferable that the width d2 (short side length) of the short side 81b of the shadow mask 81 is not less than 200 mm. This is due to the reason below.

A vapor deposition rate is preferably not higher than 10 nm/s. A deposited film (vapor-deposited film) formed at a vapor deposition rate of higher than 10 nm/s will have a decreased uniformity. This reduces an organic EL property.

A vapor-deposited film typically has a film thickness of not larger than 100 nm. A vapor-deposited film having a film thickness of larger than 100 nm will require application of a high voltage. This consequently increases power consumption of a produced organic EL display device. It is therefore estimated on the basis of the vapor deposition rate and the film thickness of the vapor-deposited film that a necessary vapor deposition period is 10 seconds.

Due to limit on processing capability (tact time), a scanning rate of 13.3 mm/s or higher is necessary in order to, for example, complete vapor deposition with respect to a 2 m-wide glass substrate in 150 seconds. A processing time of 150 seconds is a tact time that allows processing of about 570 glass substrates per day.

Securing the above vapor deposition period of 10 seconds at the above scanning rate requires the shadow mask 81 to have openings 82 each having a width of at least 133 mm along the substrate scanning direction.

Assuming that approximately 30 mm is appropriate for a distance (margin width d7; see FIG. 1) from an end of an opening 82 to a corresponding end of the shadow mask 81, the shadow mask 81 requires a width, along the substrate scanning direction, of 133+30+30 which approximately equals 200 mm.

The shadow mask 81 thus preferably has a short side length (that is, the width d2) of not less than 200 mm. The short side length is, however, not limited to not less than 200 mm if there is a change in the vapor deposition rate, the film thickness of the vapor-deposited film, and/or the allowable amount of the tact time.

The present embodiment assumed that a scanning rate of the TFT substrate 10 was 30 mm/s.

FIG. 10 is a flowchart illustrating an example method for forming a predetermined pattern on the TFT substrate 10 with use of the vapor deposition device 50 of the present embodiment.

The following specifically describes, with reference to the flow illustrated in FIG. 10, a method of FIG. 10 for forming luminescent layers 23R, 23G, and 23B with use of the vapor deposition device 50.

The method first, as illustrated in FIG. 3, places (fixes) the shadow mask 81 above the vapor deposition source 85 in the vacuum chamber 60 with use of the mask holding member 87 via the mask tension mechanism 88, and horizontally holds the shadow mask 81 under tension by the mask tension mechanism 88 so that no bending or elongation due to the self weight is caused to the shadow mask 81. During this step, the method simultaneously (i) maintains the distance between the vapor deposition source 85 and the shadow mask 81 with use of the mask holding member 87 and (ii) carries out an alignment with use of the alignment markers 84 of the shadow mask 81 in such a manner that the substrate scanning direction is identical to the long-side direction of the stripe-shaped openings 82 formed in the shadow mask 81. The above step assembles the mask unit 80 (preparation of a mask unit).

The method next puts the TFT substrate 10 in the vacuum chamber 60 and, as indicated in FIG. 10, carries out a rough alignment with use of the alignment markers 221 of the TFT substrate 10 which serves as the film formation substrate 200 so that each sub-pixel column of an identical color on the TFT substrate 10 has a direction that is identical to the substrate scanning direction (S11). The method holds the TFT substrate 10 with use of the substrate holding member 71 so that no bending due to the self weight is caused to the TFT substrate 10.

The method then carries out a rough alignment between the TFT substrate 10 and the shadow mask 81 (S12). The method further (i) adjusts the gap g1 (substrate-mask gap) between the TFT substrate 10 and the shadow mask 81 so that the gap g1 is uniform and (ii) places the TFT substrate 10 and the shadow mask 81 so that the TFT substrate 10 and the shadow mask 81 face each other so that centers of widths, in the orthogonal-to-scan direction (y axis direction), of luminescent regions 24R on the TFT substrate 10 align with those of widths, in the orthogonal-to-scan direction, of the openings 82 of the shadow mask 81. This allows the TFT substrate 10 and the shadow mask 81 to be aligned with each other (S13). The present embodiment adjusted the gap g1 between the TFT substrate 10 and the shadow mask 81 to approximately 200 μm throughout the entire TFT substrate 10.

The method next carried out vapor deposition of a material for a red luminescent layer 23R on the TFT substrate 10 while scanning the TFT substrate 10 at 30 mm/s.

The above step carried out a substrate scan in such a manner that the TFT substrate 10 passed above the shadow mask 81. The above step simultaneously carried out the scan and a precise alignment with use of the alignment markers 84 and 221 so that the openings 82 of the shadow mask 81 coincide with respective red sub-pixel 2R columns (that is, the center of a width, in the orthogonal-to-scan direction (y axis direction), of each of the openings 82 coincides with those of widths, in the orthogonal-to-scan direction, of luminescent regions 24R of sub-pixels 2R in a corresponding column) (S14).

The luminescent layer 23R was made of (i) 3-phenyl-4(1'-naphthyl)-5-phenyl-1,2,4-triazole (TAZ) (host material) and (ii) bis(2-(2'-benzo[4,5-α]thienyl)pyridinato-N,C3')iridium (acetylacetonate) (btp2Ir(acac)) (red-light emitting dopant). These materials (red organic materials) were co-deposited at respective vapor deposition rates of 5.0 nm/s and 0.53 nm/s to form the luminescent layer 23R.

Vapor deposition particles of the red organic materials, which vapor deposition particles are injected from the vapor deposition source 85, are deposited through the openings 82 of the shadow mask 81 and onto parts of the TFT substrate 10, which parts face the respective openings 82 of the shadow mask 81 (that is, in the luminescent regions 24R), while the TFT substrate 10 is passing above the shadow mask 81. According to the present embodiment, the red organic materials were deposited so as to have a thickness of 25 nm in the luminescent regions 24R on the TFT substrate 10 which has passed above the shadow mask 81.

The following describes, with reference to FIG. 11, a method for adjusting an alignment in S14 above.

FIG. 11 is a flowchart illustrating the method for adjusting an alignment. The alignment is adjusted according to a flow illustrated in FIG. 11.

The method first captures a substrate position of the TFT substrate 10 which serves as the film formation substrate 200, with use of the image sensor 90 (S21).

Next, the image detecting section 101 detects, on the basis of an image captured by the image sensor 90, respective images of (i) the alignment markers 221 of the TFT substrate 10 and (ii) the alignment markers 84 of the shadow mask 81 (S22).

Then, the computing section 102 calculates, from the respective images of the alignment markers 221 and 84, the respective images having been detected by the image detecting section 101, an amount of positional difference between the alignment markers 221 and the alignment markers 84 to determine a correction value for the substrate position by computation (S23).

Next, the motor drive control section 103 drives the motor 72 on the basis of the correction value to correct the substrate position (S24).

Then, the image sensor 90 detects the substrate position as corrected, after which S21 through S25 are repeated.

According to the present embodiment, the substrate position is thus repeatedly detected by the image sensor 90 so as to be corrected. This makes it possible to (i) simultaneously carry out a substrate scan and correct the substrate position so that the centers of the widths, in the orthogonal-to-scan direction (y axis direction), of the luminescent regions 24R on the TFT substrate 10 align with those of the widths, in the orthogonal-to-scan direction, of the openings 82 of the shadow mask 81 and (ii) consequently form a film while carrying out a precise alignment between the TFT substrate 10 and the shadow mask 81.

The thickness of the luminescent layer 23R can be adjusted on the basis of (i) a reciprocating scan (that is, reciprocating movement of the TFT substrate 10) and (ii) a scanning rate. As indicated in FIG. 10, after the scan in S14, the present embodiment (i) reversed the direction of scanning the TFT substrate 10 and (ii) further deposited red organic materials on the red organic materials which have been deposited in S14 by the same method as S14 (S16). This formed a luminescent layer 23R having a thickness of 50 nm.

While in S14 through S16, the non-vapor deposition region on the TFT substrate 10 was located directly above the openings 82 of the shadow mask 81 (for example, during the period after the step in S14 ends and before the direction of scanning the TFT substrate 10 is reversed in S16), the shutter 89 was inserted between the vapor deposition source 85 and the shadow mask 81 to prevent vapor deposition particles from adhering to the non-vapor deposition region (S15).

The following describes, with reference to FIGS. 12 and 13, a vapor deposition control with use of the shutter 89 in S15.

FIG. 12 is a flowchart illustrating a flow of a vapor deposition control carried out while vapor deposition is turned OFF. FIG. 13 is a flowchart illustrating a flow of a vapor deposition control carried out while vapor deposition is turned ON.

The description below first deals with the flow carried out while vapor deposition is turned OFF.

As indicated in FIG. 12, the substrate position of the TFT substrate 10 which serves as the film formation substrate 200 is constantly captured by the image sensor 90 during a vapor deposition process as described above with reference to FIG. 11 (S31).

As indicated in FIG. 11, the image detecting section 101 detects, on the basis of the image captured by the image sensor 90, the respective images of (i) the alignment markers 221 of the TFT substrate 10 and (ii) the alignment markers 84 of the shadow mask 81. The image detecting section 101 detects, as an alignment marker 221 of the TFT substrate 10, a rear-end marker indicative of a rear-end of the display region 210 so as to detect the rear-end of the display region 210 as indicated in FIG. 12 (S32).

When the image detecting section 101 has detected the rear-end of the display region 210 as described above, the vapor deposition ON/OFF control section 104 generates a vapor deposition OFF signal (S33).

Upon receipt of the vapor deposition OFF signal from the vapor deposition ON/OFF control section 104, the shutter drive control section 105 closes the shutter 89 (S34). The shutter 89 thus closed prevents vapor deposition particles from reaching the mask, which achieves the state of vapor deposition OFF (S35).

The description below now deals with the flow carried out while vapor deposition is turned ON.

As indicated in FIG. 13, the substrate position of the TFT substrate 10 which serves as the film formation substrate 200 is, as described above, constantly captured by the image sensor 90 during a vapor deposition process (S41).

The image detecting section 101 detects, as an alignment marker 221 of the TFT substrate 10, a start-end marker indicative of a start-end of the display region so as to detect the start-end of the display region 210 (S42).

When the image detecting section 101 has detected the start-end of the display region 210, the vapor deposition ON/OFF control section 104 generates a vapor deposition ON signal (S43).

Upon receipt of the vapor deposition ON signal from the vapor deposition ON/OFF control section 104, the shutter drive control section 105 opens the shutter 89 (S44). The shutter 89 thus opened allows vapor deposition particles to reach the mask, which achieves the state of vapor deposition ON (S45).

The reciprocating scan in S16 above is carried out as follows: First, during S21 through S24, the TFT substrate 10 is scanned while a precise alignment is carried out. When the image detecting section 101 has detected the rear-end of the display region 210, the motor drive control section 103 drives the motor 72 to reverse the direction of scanning the TFT substrate 10. During this operation, (i) vapor deposition is turned OFF by carrying out S31 through S35, (ii) the substrate position of the TFT substrate 10 is corrected by carrying out S21 through S24 and (iii) vapor deposition is turned ON at the start-end of the display region 210 by carrying out S41 through S45. Then, the TFT substrate 10 is scanned again while a precise alignment is carried out, by carrying out S21 through S24.

In this way, the luminescent layer 23R, which has gently-inclined side surfaces 23s in opposite parts, along the orthogonal-to-scan direction (y axis direction), of the luminescent layer 23R, is formed so as to completely cover the luminescent region 24R (see (a) of FIG. 14). More specifically, the luminescent layer 23R is formed so that (i) a width, in the orthogonal-to-scan direction, of the flat part 23t (part other than the inclined side surfaces 23s) is equal to the width, in the orthogonal-to-scan direction, of the luminescent region 24R and (ii) a width, in the orthogonal-to-scan direction, of one of the inclined side surfaces 23s is not larger than the width C (for example, 20 µm), in the orthogonal-to-scan direction, of the non-luminescent region 29 between the luminescent region 24R and a luminescent region (for example, the luminescent region 24G) which is adjacent to the one of the inclined side surfaces 23s. For example, the width, in the orthogonal-to-scan direction, of the one of the inclined side surfaces 23s is not smaller than half of the width C but not larger than the width C, that is, for example, 15 µm. Note that for convenience of illustration, (a) of FIG. 14 illustrates only the luminescent region 24G, which is adjacent to one side of the luminescent region 24R. However, there exists a luminescent region that is adjacent to the other side of the luminescent region 24R.

In (a) of FIG. 14, the luminescent layer 23R is formed (i) so as to completely cover the luminescent region 24R and (ii) so that the center of a width, in the orthogonal-to-scan direction (y axis direction), of the luminescent layer 23R aligns with that of the width, in the orthogonal-to-scan direction, of the luminescent region 24R. However, in a case where the center of the width, in the orthogonal-to-scan direction, of the opening 82 of the shadow mask 81 is displaced toward one side along the orthogonal-to-scan direction by a predetermined distance (specifically, a distance not more than an estimated maximum displacement, e.g., not more than 15 µm) from the center of the width, in the orthogonal-to-scan direction, of the luminescent region 24R, the center of the width, in the orthogonal-to-scan direction, of an obtained luminescent layer 23R is displaced toward the one side along the orthogonal-to-scan direction by the predetermined distance from the center of the width, in the orthogonal-to-scan direction, of the luminescent region 24R (see (b) of FIG. 14). Even in that case, the luminescent layer 23R still completely covers the luminescent region 24R.

In other words, the luminescent layer 23R's end part on the other side along the orthogonal-to-scan direction extends toward the other side so that the luminescent layer 23R entirely covers the luminescent region 24R even in the case where the center of the width, in the orthogonal-to-scan direction, of the opening 82 of the shadow mask 81 is displaced toward the one side along the orthogonal-to-scan direction by the predetermined distance from the center of the width, in the orthogonal-to-scan direction, of the luminescent region 24R (see (b) of FIG. 14). Similarly, the luminescent layer 23R's end part on the one side also extends toward the one side. The width B, in the orthogonal-to-scan direction, of the one of the inclined side surfaces 23s is set so that, in a case where the center of the width, in the orthogonal-to-scan direction, of the opening 82 of the shadow mask 81 is displaced toward the one side along the orthogonal-to-scan direction from the center of the width, in the orthogonal-to-scan direction, of the luminescent region 24R and thus the luminescent layer 23R overlaps an adjacent luminescent region (for example, the luminescent region 24G), only the one of the inclined side surfaces 23s of the luminescent layer 23R partially overlaps the luminescent region 24G. The width B, in the orthogonal-to-scan direction, of the other of the inclined side surfaces 23s is also set in a similar manner.

An example of such setting is a setting in which the width, in the orthogonal-to-scan direction, of the luminescent layer 23R is larger than the sum of (i) the width, in the orthogonal-to-scan direction, of the luminescent region 24R and (ii) the width, in the orthogonal-to-scan direction, of the non-luminescent region 29 between the luminescent regions 24R and 24G.

The present embodiment, after S16, took the TFT substrate 10, on which the luminescent layer 23R was formed, out of the vacuum chamber 60 (S17), and then formed a green luminescent layer 23G with use of (i) a mask unit 80 for forming the green luminescent layer 23G and (ii) a vacuum chamber 60 in a manner similar to the above process of forming the luminescent layer 23R.

The present embodiment, after thus forming the luminescent layer 23G, formed a blue luminescent layer 23B with use of (i) a mask unit 80 for forming the blue luminescent layer 23B and (ii) a vacuum chamber 60 in a manner similar to the respective processes of forming the luminescent layers 23R and 23G.

That is, the present embodiment, for each of the processes of forming the luminescent layers 23G and 23B, prepared the shadow mask 81 having openings 82 at positions for a corresponding one of the luminescent layers 23G and 23B. The present embodiment placed each of the shadow masks 81 in a vacuum chamber 60 for forming a corresponding one of the luminescent layers 23G and 23B, and then carried out a vapor deposition by scanning the TFT substrate 10 while carrying out an alignment so that the opening 82 of the shadow mask 81 coincides with a corresponding one of a sub-pixel 2G column and a sub-pixel 2B column.

The luminescent layer 23G was made of (TAZ) (host material) and Ir(ppy) 3 (green-light emitting dopant). These materials (green organic materials) were co-deposited at respective vapor deposition rates of 5.0 nm/s and 0.67 nm/s so as to form the luminescent layer 23G.

The luminescent layer 23B was made of TAZ (host material) and 2-(4'-t-butyl phenyl)-5-(4"-biphenylyl)-1,3,4-oxadiazole (t-Bu PBD) (blue-light emitting dopant). These materials (blue organic materials) were co-deposited at respective vapor deposition rates of 5.0 nm/s and 0.67 nm/s so as to form the luminescent layer 23B.

The luminescent layers 23G and 23B each had a thickness of 50 nm.

The above steps prepared the TFT substrate 10 on which respective patterns of the luminescent layers 23R, 23G, and 23B having respective colors of red (R), green (G), and blue (B) were formed.

As has been described, according to the present embodiment, by producing the organic EL display device 1 by the above-described vapor deposition method by use of the vapor deposition device 50 which serves as a device for producing the organic EL display device 1, it is possible to provide the organic EL display device 1 capable of, unlike a conventional device, (i) reducing a degree of color mixture even in a case where the luminescent layer 23R, 23G, or 23B overlaps its adjacent luminescent region and (ii) preventing a film (luminescent layer) from becoming absent even in a case where a pattern of the luminescent layer 23R, 23G, or 23B is displaced.

That is, as illustrated in (a) of FIG. 14, the luminescent layer (for example, the luminescent layer 23R) of the present embodiment is formed so that (i) the width, in the orthogonal-to-scan direction (y axis direction), of the flat part 23t (part other than the inclined side surfaces 23s) is equal to the width, in the orthogonal-to-scan direction, of the luminescent region 24R, (ii) the inclined side surfaces 23s are gently inclined and (iii) the width B, in the orthogonal-to-scan direction, of each of the inclined side surfaces 23s is not larger than the width C (for example, 20 µm), in the orthogonal-to-scan direction, of the non-luminescent region 29 (for example, the width B is not smaller than half of the width C but not larger than the width C, that is, for example, 15 μm).

Therefore, as illustrated in (a) of FIG. 14, in a case where the center of the opening 82 of the shadow mask 81 coincides with the center of the luminescent region 24R (that is, in a case where the pattern of the luminescent layer 23R is not displaced), (i) the luminescent layer 23R does not overlap an adjacent luminescent region (for example, the luminescent region 24G) and (ii) a full-thickness part of the luminescent layer 23R completely covers the entire luminescent region 24R. This causes neither color mixture nor absence of a film.

On the other hand, as illustrated in (b) of FIG. 14, even in a case where the pattern of the luminescent layer 23R is displaced due to displacement of the center, in the orthogonal-to-scan direction (y axis direction), of the opening toward the one side along the orthogonal-to-scan direction by a predetermined distance (for example, 12 μm) from the center, in the orthogonal-to-scan direction, of the luminescent region 24R, the luminescent layer 23R still completely covers the luminescent region 24R. This causes neither absence of a film nor complete color mixture, though an incomplete color mixture region F1 and a thickness reduction region F2 appear.

The incomplete color mixture region F1 is a region where one of the inclined side surfaces 23s of the luminescent layer 23R partially overlaps the adjacent luminescent region (for example, the luminescent region 24G). In the incomplete color mixture region F1, however, the one of the inclined side surfaces 23s has a thickness smaller than the full thickness (that is, the thickness of a flat part 23t) of the luminescent layers 23R, 23G, and 23B. Therefore, less color mixture is caused than a conventional case.

The thickness reduction region F2 is a region where the other of the inclined side surfaces 23s of the luminescent layer 23R overlaps the luminescent region 24R. In the thickness reduction region F2, the luminescent region 24R is covered with the other of the inclined side surfaces 23s. Therefore, the properties (emission properties) obtained are inferior to those obtained in a case where the luminescent region 24R is covered with a full-thickness part of the luminescent layer 23R. However, no absence of a film is caused, and therefore a part that emits no light is not generated and no leak currents appear. As such, according to the present embodiment, it is possible to reduce the degree of color mixture and prevent a film from becoming absent even in a case where the pattern of the luminescent layer 23R is displaced.

The present embodiment has thus described a case where the width, in the orthogonal-to-scan direction, of the opening 82 is equal to the width, in the orthogonal-to-scan direction, of the luminescent region 24R (that is, a case where the width, in the orthogonal-to-scan direction, of the luminescent layer 23R is equal to the width, in the orthogonal-to-scan direction, of the luminescent region 24R). This, however, does not imply any limitation. For example, illustrated in (a) of FIG. 18, the following arrangement can be employed: the width, in the orthogonal-to-scan direction (y axis direction), of the opening 82 is larger than a width, in the orthogonal-to-scan direction, of a luminescent region (that is, a case where the width, in the orthogonal-to-scan direction, of the luminescent layer 23R is larger than the width, in the orthogonal-to-scan direction, of the luminescent region 24R). Note that an end of the luminescent layer 23R is in contact with its adjacent luminescent region 24G.

(b) of FIG. 18 illustrates a case where a pattern of the luminescent layer 23R is displaced as a result of displacement of a center of the width, in the orthogonal-to-scan direction (y axis direction), of the opening 82 of the shadow mask 81 toward one side along the orthogonal-to-scan direction by a predetermined distance (for example, 12 μm) from a center of the width, in the orthogonal-to-scan direction, of the luminescent region 24R. In this case, the incomplete color mixture region F1 is wider than that illustrated in (b) of FIG. 14, whereas the thickness reduction region F2 is narrower than that illustrated in (b) of FIG. 14. That is, a change in the width of the opening 82 causes a change in each of the widths of the incomplete color mixture region F1 and of the thickness reduction region F2. This makes it possible to select a condition under which a property of the luminescent layer 23R is most unlikely to be deteriorated.

According to the present embodiment, the luminescent layer 23R can have any size as long as the luminescent layer 23R is formed so that, for example, (i) a width, in the orthogonal-to-scan direction, of the flat part 23t of the luminescent layer 23R is not smaller than a width, in the orthogonal-to-scan direction, of the luminescent region 24R, (ii) the width B, in the orthogonal-to-scan direction, of each of the inclined side surfaces 23s of the luminescent layer 23R is smaller than the width C, in the orthogonal-to-scan direction, of the non-luminescent region 29 between the luminescent region 24R and a luminescent region (for example, the luminescent region 24G) that is adjacent to the inclined side surface 23s (for example, the width B is larger than half of the width C but smaller than the width C) and (iii) the width, in the orthogonal-to-scan direction, of the luminescent layer 23R is not larger than the sum of (a) the width, in the orthogonal-to-scan direction, of the luminescent region 24R and (b) the widths, in the orthogonal-to-scan direction, of non-luminescent regions 29 which sandwich the luminescent region 24R.

The descriptions so far were based on the luminescent layer 23R. Note, however, that the same applies to luminescent layers 23G and 23B.

On the other hand, according to an organic EL display device which is produced by a conventional vapor deposition method, end parts, along the orthogonal-to-scan direction, of each of luminescent layers 23R, 23G, and 23B are steep. It is therefore impossible to simultaneously (i) prevent a film from becoming absent and (ii) reduce the degree of color mixture.

For example, as illustrated in (a) of FIG. 19, a luminescent region (for example, a luminescent region 24R) is covered with a full-thickness part of a luminescent layer 23R in a case where (i) an opening 82 of a shadow mask 81 has a typical width in the orthogonal-to-scan direction (that is, a case where an end of the width, along the orthogonal-to-scan direction, of the opening 82 is at the center of a width C, in the orthogonal-to-scan direction, of a non-luminescent region 29) and (ii) the center of the width, in the orthogonal-to-scan direction, of the opening 82 aligns with the center of a width, in the orthogonal-to-scan direction, of the luminescent region 24R. Note that in this case, the width C is 20 μm, and therefore a margin between the luminescent layer 23R and its adjacent luminescent region (for example, a luminescent region 24G) is 10 μm.

On the other hand, as illustrated in (b) of FIG. 19, a complete color mixture region F3 and a complete absence region F4 appear in a case where a pattern of the luminescent layer 23R is displaced as a result of displacement of the center of the width, in the orthogonal-to-scan direction (y axis direction), of the opening 82 toward one side along the orthogonal-to-scan direction by a predetermined distance (for example, 12 μm) from the center of the width, in the orthogonal-to-scan direction, of the luminescent region 24R. The complete color mixture region F3 is a region where the full-thickness part of the luminescent layer 23R overlaps the adjacent luminescent region (for example, the luminescent region 24G). The complete absence region F4 is a region where the luminescent layer 23R is completely absent.

In the complete color mixture region F3, in which the full-thickness part of the luminescent layer 23R overlaps the adjacent luminescent region 24G, colors are mixed to a great extent. In contrast, since no luminescent layer 23R exists in the complete absence region F4, a current flowing in this region becomes a leak current. The leak current not only leads to a reduction in currents which contribute to emission of light and thereby decreases a pixel luminance, but also (i) causes a short circuit between electrodes and (ii) generates heat which may cause a problem in lighting of a pixel. This ultimately decreases a reliability of an organic EL display device.

Assume that, in order to eliminate the complete color mixture region F3, the width, in the orthogonal-to-scan direction (y axis direction), of the opening 82 of the shadow mask 81 is reduced as illustrated in (a) of FIG. 20. Note here that, the center of the width, in the orthogonal-to-scan direction, of the opening 82 aligns with that of the width, in the orthogonal-to-scan direction, of the luminescent region 24R. The margin between the luminescent layer 23R and the adjacent luminescent region 24G is, for example, 15 µm.

In this case, as illustrated in (b) of FIG. 20, even if the pattern of the luminescent layer 23R is displaced as a result of displacement of the center of the width, in the orthogonal-to-scan direction (y axis direction), of the opening 82 toward one side along the orthogonal-to-scan direction by a predetermined distance (for example, 12 µm) from the center of the width, in the orthogonal-to-scan direction, of the luminescent region 24R, no complete color mixture region F3 appears since there is the margin between the luminescent layer 23R and the adjacent luminescent region 24G. However, the complete absence region F4 becomes larger on the other side of the luminescent region 24R than that illustrated in (b) of FIG. 19. This is worse.

Assume that, in order to eliminate the complete absence region F4, the width, in the orthogonal-to-scan direction (y axis direction), of the opening 82 is increased as illustrated in (a) of FIG. 21. Note here that the center of the width, in the orthogonal-to-scan direction, of the opening 82 aligns with the center of the width, in the orthogonal-to-scan direction, of the luminescent region 24R. The margin between the luminescent layer 23R and the adjacent luminescent region 24G is, for example, 5 µm.

In this case, as illustrated in (b) of FIG. 21, even if the pattern of the luminescent layer 23R is displaced as a result of displacement of the center of the width, in the orthogonal-to-scan direction (y axis direction), of the opening 82 toward the one side along the orthogonal-to-scan direction by a predetermined distance (for example, 12 µm) from the center of the width, in the orthogonal-to-scan direction, of the luminescent region 24R, no complete absence region F4 appears in the luminescent region 24R. However, the complete color mixture region F3 becomes larger in the adjacent luminescent region 24G than that illustrated in (b) of FIG. 19. This is worse. Note that, although the descriptions so far were based on the luminescent layer 23R, the same applies to luminescent layers 23G and 23B.

As has been described, according to the organic EL display device which is produced by the conventional vapor deposition method, any adjustment to the width of the opening 82 in the orthogonal-to-scan direction is not good enough to prevent problems such as the complete color mixture region F3 and/or the complete absence region F4, which problems occur in a case where the opening 82 is displaced relative to the luminescent region 24R, 24G, or 24B by not smaller than half of the width C of the non-luminescent region 29. In contrast, according to the present embodiment, the problems such as the complete color mixture region F3 and/or the complete absence region F4 do not occur though the incomplete color mixture region F1 appears, as described above.

How much a luminescent layer 23R, 23G or 23B is displaced depends on (i) an accuracy of positioning of the shadow mask 81 and the film formation substrate 200 (TFT substrate 10) and (ii) dimensional accuracies of the shadow mask 81 and the film formation substrate 200. In order to alleviate the problems, the following two methods are available: (1) increasing the accuracy and the dimensional accuracies and (2) increasing the width of the non-luminescent region. However, the method (1) depends on a performance of a production device, and it is therefore difficult to increase the accuracy and the dimensional accuracies. As to the method (2), the width of the non-luminescent region can be increased by narrowing luminescent regions. This, however, reduces a surface area from which light is emitted. Therefore, a further higher current density is required so as to obtain a luminance equivalent to that obtained before the reduction of the surface area. An increase in the current density shortens lives of the luminescent regions (that is, the increase accelerates decrease of emission intensity). This ultimately decreases a reliability of an organic EL display device. Further, the narrowing of the luminescent regions results in an increase of a distance between the luminescent regions. This causes an organic EL display device to display a rough image (that is, an image is not uniform but looks like a collection of particles). That is, a display quality decreases.

The present embodiment (i) can easily increase the accuracy and the dimensional accuracies because it does not depend on a performance of a production device unlike the method (1) and (ii) does not cause a deterioration in a display quality because it does not increase the width of the non-luminescent region unlike the method (2).

In the present embodiment, a side surface of a luminescent layer (vapor-deposited film) 23R, 23G or 23B is defined as a "region from an end, on one of opposite sides along the orthogonal-to-scan direction, of an opening 82 (that is, an end, on one of the opposite sides along the orthogonal-to-scan direction, of a flat part 23t of the luminescent layer 23R, 23G or 23B) to an end, on the same side, of the luminescent layer 23R, 23G or 23B (that is, such an end is a place where the thickness of the luminescent layer 23R, 23G or 23B becomes zero)". However, the side surface is not limited to such definition. The side surface can be defined, for example, as a "region where a thickness of an end portion of the luminescent layer 23R, 23G or 23B is small", and can be further defined that "a side surface starts from a starting end where a thickness of the luminescent layer 23R, 23G or 23B is reduced by X %". Note that what is meant by the "starting end" is a boundary between the flat part 23t and an inclined side surface 23s of the luminescent layer 23R, 23G or 23B.

In the present embodiment, the inclined side surfaces 23s of each of the luminescent layers 23R, 23G and 23B are formed so as to be gently inclined as described above, by adjusting the gap g1 between the shadow mask 81 and the film formation substrate 200 (TFT substrate 10). However, the inclined side surfaces 23s can be formed so as to be gently inclined as described above by adjusting a thickness d81 (see FIG. 3) of the shadow mask 81. That is, an increase in the thickness d81 results in a reduction the width B of each of the inclined side surfaces 23s because vapor deposition particles, which have a large velocity component in a direction (y axis direction) orthogonal to the substrate, are difficult to pass through the openings 82. On the other hand, a decrease in the thickness d81 results in an increase in the width B of each of the inclined side surfaces 23s because vapor deposition particles, which have a large velocity component in the direction (y axis direction) orthogonal to the substrate, easily pass through the openings 82.

The present embodiment is arranged such that the mask unit 80 is fixedly placed in the vacuum chamber 60. The present embodiment is, however, not limited to such an arrangement.

The vapor deposition device 50 can include, instead of the substrate moving mechanism 70, (i) the substrate holding member 71 (for example, an electrostatic chuck) for fixing the film formation substrate 200 and (ii) a mask unit moving mechanism (mask unit moving means) for moving the mask unit 80 relative to the film formation substrate 200 while maintaining a relative location of the shadow mask 81 and the vapor deposition source 85 to each other. The vapor deposition device 50 can alternatively include both the substrate moving mechanism 70 and the mask unit moving mechanism.

In other words, the film formation substrate 200 and the mask unit 80 simply need to be so provided that at least one of them is moveable relative to the other. The advantages of the present invention can be achieved regardless of which of the film formation substrate 200 and the mask unit 80 is arranged to move.

In a case where the mask unit 80 is moved relative to the film formation substrate 200 as described above, the mask unit 80 is arranged, for example, such that the shadow mask 81 and the vapor deposition source 85 are moved, relative to the film formation substrate 200, together with the mask holding member 87 (for example, an identical holder). This arrangement makes it possible to move the mask unit 80 relative to the film formation substrate 200 while maintaining the relative location of the shadow mask 81 and the vapor deposition source 85 to each other.

In the case where the mask unit 80 is moved relative to the film formation substrate 200 as described above, the shadow mask 81 and the vapor deposition source 85 are preferably so held by, for example, the identical holder (holding member; holding means) as to be integrated with each other.

Note, however, that, in the case where the film formation substrate 200 is moved relative to the mask unit 80 as described above, the shadow mask 81 and the vapor deposition source 85 simply need to be fixed in a location relative to each other, but do not necessarily need to be integrated with each other.

The mask unit 80 may be arranged, for example, such that (i) the vapor deposition source 85 is fixed to, for example, a bottom wall among inner walls of the vacuum chamber 60, (ii) the mask holding member 87 is fixed to one of the inner walls of the vacuum chamber 60, and consequently (iii) the shadow mask 81 and the vapor deposition source 85 are fixed in the location relative to each other.

The present embodiment has described an example case in which the openings 82 of the shadow mask 81 aligned with the injection holes 86 of the vapor deposition source 85 so that the injection holes 86 are each positioned inside one of the openings 82 in a plan view and that the openings 82 are provided in a one-to-one correspondence with the injection holes 86. The present embodiment is, however, not limited to the example case. The openings 82 do not necessarily need to be formed so as to face the respective injection holes 86.

Specifically, the openings 82 can have a pitch p that is unequal to a pitch of the injection holes 86. Further, the width d5 or the width d6 of the openings 82 does not need to equal an opening width (opening diameter) of the injection holes 86. For example, in an example illustrated in FIG. 1, the injection holes 86 can have an opening diameter that is larger or smaller than the width d6 of the openings 82. In addition, a plurality of injection holes 86 can be provided for an opening 82, whereas an injection hole 86 can be provided for a plurality of openings 82. Further, some (that is, at least one) of a plurality of injection holes 86 or a partial region of an injection hole 86 can be provided so as to face a non-opening section (that is, a region of the shadow mask 81, which region is other than the openings 82; for example, a region between any adjacent ones of the openings 82).

In order to improve a material use efficiency, the openings 82 are desirably formed for the respective injection holes 86.

The present embodiment has described an example case in which both (i) the openings 82 of the shadow mask and (ii) the injection holes 86 of the vapor deposition source 85 are arranged one-dimensionally. The present embodiment is, however, not limited to such an arrangement. Both the openings 82 of the shadow mask 81 and the injection holes 86 of the vapor deposition source 85 can be two-dimensionally arranged, provided that the openings 82 face the respective injection holes 86.

The present embodiment has described an example case involving the plurality of openings 82 in the shadow mask 81 and the plurality of injection holes 86 in the vapor deposition source 85. The present embodiment is, however, not limited to the example case. The shadow mask 81 is simply required to have at least one opening 82, and the vapor deposition source 85 is simply required to have at least one injection hole 86.

The present embodiment has described an example case in which the shadow mask 81 has slit-shaped openings 82. The shape of the openings 82 can, however, be set as appropriate so as to form a desired vapor deposition pattern, and therefore is not particularly limited to any specific one.

The present embodiment has described an example case in which the substrate moving mechanism 70 includes an electrostatic chuck as the substrate holding member 71. Using the electrostatic chuck to hold the film formation substrate 200 as described above can effectively prevent the film formation substrate 200 from bending due to its weight.

The present embodiment is, however, not limited to the example case. Depending on a size of the film formation substrate 200, the substrate holding member 71 can be a holding member such as a roller for applying tension to the substrate so as to mechanically sandwich and hold the substrate.

The present embodiment has described an example case involving, as the shutter 89, a shutter which is provided so as to move in between or so as to be away from the shadow mask 81 and the vapor deposition source 85. The present embodiment is, however, not limited to the example case. The present embodiment can alternatively be arranged, for example, such that (i) the vapor deposition source 85 is a vapor deposition source 85 that can be switched ON/OFF and (ii) when a portion of the film formation substrate 200, which portion needs no vapor deposition, is positioned in an opening region (that is, a region facing an opening 82) of the shadow mask 81, vapor deposition is turned OFF so that no vapor deposition molecules fly.

The present embodiment can alternatively be arranged, for example, such that the shutter 89 is a shutter 89 which is provided to the vapor deposition source 85 so as to close the injection holes 86 of the vapor deposition source 85 so that vapor deposition particles are not emitted (released) from the injection holes 86.

The present embodiment can further alternatively be arranged such that instead of providing the shutter 89 to the injection holes 86, the vapor deposition source 85 is switched ON/OFF in response to a vapor deposition ON signal or a vapor deposition OFF signal so as not to generate vapor deposition particles.

The present embodiment has described an example method for producing an organic EL display device 1 of the bottom emission type which extracts light from a TFT substrate 10 side. The present embodiment is, however, not limited to the example method. The present invention is also suitably applicable to an organic EL display device 1 of a top emission type which extracts light from a sealing substrate 40 side.

The present embodiment has described an example case that uses a glass substrate as a supporting substrate for the TFT substrate 10 and the sealing substrate 40. The present embodiment is, however, not limited to the example case.

Each of the supporting substrates which constitute the TFT substrate 10 and the sealing substrate 40, respectively, can be other than a glass substrate, for example, a transparent substrate such as a plastic substrate, in the case where the organic EL display device 1 is an organic EL display device of a bottom emission type. In contrast, each of the supporting substrates can be other than the above-described transparent substrate, for example, an opaque substrate such as a ceramics substrate, in a case where the organic EL display device 1 is an organic EL display device of a top emission type.

The present embodiment has described an example case involving anodes (in the present embodiment, the first electrodes 21) which are formed in a matrix manner. The anodes are, however, not particularly limited in terms of shape, material, and size as long as they function as electrodes for supplying positive holes to an organic EL layer. The anodes can have, for example, a stripe shape. Note that by the nature of organic EL elements, at least one(s) of the anodes and a cathode is (are) preferably transparent. An organic EL element typically includes a transparent anode.

Embodiment 2

The following will describe another embodiment of the present invention with reference to FIGS. 22 and 23.

In Embodiment 2, an inclined side surface 23s is formed so as to be non-uniformly inclined, unlike Embodiment 1 in which each of the inclined side surfaces 23s of each of the luminescent layers 23R, 23G and 23B is uniformly inclined.

More specifically, as illustrated in (a) of FIG. 22, an inclined side surface 23s of the present embodiment is formed so that (i) opposite end portions 23p and 23r, along the orthogonal-to-scan direction (y axis direction), of the inclined side surface 23s are more gently included and (ii) a middle portion 23q of the inclined side surface 23s along the orthogonal-to-scan direction, is inclined most steeply.

The inclined side surface 23s is arranged such that (i) the end portions 23p and 23r are more gently inclined and (ii) the middle portion 23q is inclined most steeply. Therefore, even in a case where an incomplete color mixture region F1 and a thickness reduction region F2 appear due to displacement of a pattern of a luminescent layer 23R, effects of the incomplete color mixture region F1 and the thickness reduction region F2 can be reduced to a greater extent than Embodiment 1 (see (b) of FIG. 22).

Specifically, in the incomplete color mixture region F1, an end portion 23p of an inclined side surface 23s on one side of the luminescent layer 23R in a luminescent region 24R, which end portion 23p is on the one side, overlaps an adjacent luminescent region (for example, a luminescent region 24G) (see (b) of FIG. 22). However, since the end portion 23p is inclined more gently than a corresponding portion of the inclined side surface 23s of Embodiment 1, the end portion 23p has a thickness smaller than that of the corresponding portion of the inclined side surface 23s of Embodiment 1, and therefore less incomplete color mixture occurs. Meanwhile, in the thickness reduction region F2 in the luminescent region 24R, a thickness of the luminescent layer 23R is small due to an inclined side surface 23s on the other side. However, since an end portion 23r on the one side of the inclined side surface 23s is inclined more gently than a corresponding portion of the inclined side surface 23s of Embodiment 1, the end portion 23r is thicker than the corresponding portion of the inclined side surface 23s of Embodiment 1, and therefore an effect of thickness reduction is further alleviated.

As such, the inclined side surface 23s of Embodiment 2 can reduce an effect which is caused by displacement of the pattern of the luminescent layer 23R to a greater extent than Embodiment 1. It is therefore possible to produce an organic EL display device having a higher reliability. Note that, although the descriptions so far were based on the luminescent layer 23R, the same applies to luminescent layers 23G and 23B.

The inclined side surface 23s (see (a) of FIG. 22) can have any shape, provided that (i) the opposite end portions 23p and 23r of the inclined side surface 23s are gently inclined and (ii) the middle portion 23q of the inclined side surface 23s is inclined most steeply. An example of the shape is a sinusoidal shape.

For example, assume that, as shown in FIG. 23, (i) the maximum thickness of a flat part 23t (that is, part other than inclined side surfaces 23s) of a luminescent layer 23R is $H_0$, (ii) a width, in the orthogonal-to-scan direction, of the inclined side surface 23s is B, and (iii) a thickness, of the luminescent layer 23R, which is measured at a position away, by x along the orthogonal-to-scan direction (y axis direction), from a starting end T1 (an end closer to the flat part 23t) of the inclined side surface 23s toward an ending end T2 (an end away from the flat part 23t) of the inclined side surface 23s is H(x). In this case, H(x) is represented by the following Expression 1:

$$H(x) = \frac{H_0}{2}\left\{\cos\left(\frac{\pi}{B}x\right) + 1\right\} \quad \text{(Expression 1)}$$

In Expression 1, the maximum $k_{max}$ of the absolute value of a gradient is represented by Expression 2.

$$k_{max} = \frac{\pi}{2} \cdot \frac{H_0}{B} \quad \text{(Expression 2)}$$

The maximum $k_{max}$ is $\pi/2$ times the gradient of the inclined side surface 23s illustrated in FIG. 15 of Embodiment 1. In other words, the upper limit of the absolute value of the gradient of the inclined side surface 23s in the present embodiment is not more than $(\pi/2) \times 1/200$.

Embodiment 3

The following will describe yet another embodiment of the present invention with reference to FIGS. 24 and 25.

In Embodiment 3, a width B of an inclined side surface 23s is adjusted with use of a restriction board, unlike Embodiment 1 in which the width B of the inclined side surface 23s (that is, a gradient (H/B)) is adjusted by adjusting the gap g1 between the shadow mask 81 and the film formation substrate 200. A vapor deposition method and a vapor deposition device of the present embodiment will be described as below, with reference to FIGS. 24 and 25.

A vapor deposition device 150 of the present embodiment is the same as the vapor deposition device 50 of Embodiment 1 except that the vapor deposition device 150 further includes a restriction board 300 (see FIG. 24). The restriction board 300 is provided between a shadow mask 81 and a vapor deposition source 85 so as to be (i) parallel to the shadow mask 81 and (ii) separated from the vapor deposition source 85 by a predetermined gap g3 (see FIG. 25). The position of the restriction board 300 relative to the shadow mask 81 and the vapor deposition source 85 is fixed.

The restriction board 300 is a plate which has, for example, (i) a rectangular shape when viewed from above and (ii) a predetermined thickness d300. The restriction board 300 has (i) a long side 300a whose length d300a is, for example, substantially equal to a length d1 of a long side 81a of the shadow mask 81 and (ii) a short side 300b whose length d300b is, for example, substantially equal to a length d2 of a short side 81b of the shadow mask 81. Note that the long side 300a of the restriction board 300 is parallel to the long side 81a of the shadow mask 81, and the short side 300b of the restriction board 300 is parallel to the short side 81b of the shadow mask 81.

The restriction board 300 has a plurality of openings 300A. Each of the openings 300A has a rectangular shape which extends along the short side 300b of the restriction board 300 when viewed from above. Further, the openings 300A are arranged at regular intervals along the long side 300a of the restriction board 300 so as to face respective injection holes 86 in the vapor deposition source 85.

According to the vapor deposition device and the vapor deposition method of the present embodiment, as illustrated in FIG. 25, vapor deposition particles injected from the injection holes 86 of the vapor deposition source 85 (i) pass through the openings 300A facing the respective injection holes 86 and then pass through openings 82 of the shadow mask 81 and (ii) are deposited onto a film formation substrate 200 so as to form a vapor-deposited film 211 (for example, a luminescent layer 23R) on the film formation substrate 200. Note that the restriction board 300 and the shadow mask 81 are designed so that vapor deposition particles which are to form the vapor-deposited film 211 certainly pass through the openings 300A and 82.

The vapor deposition particles here are injected from the injection holes 86 of the vapor deposition source 85 so as to spread to a certain degree. When these vapor deposition particles enter the openings 300A, some of the vapor deposition particles which have a large velocity component in the orthogonal-to-scan direction (y axis direction) adhere to the restriction board 300, and therefore cannot reach the openings 82. That is, the restriction board 300 restricts an incident angle of vapor deposition particles which enter the openings 82, as viewed along the orthogonal-to-scan direction (y axis direction). Note here that the incident angle of the vapor deposition particles which enter the openings 82 is defined by an angle between a z axis and a direction in which vapor deposition particles travel.

Note that an incident angle of the vapor deposition particles which enter the openings 82, as viewed along the substrate scanning direction (x axis direction), is not limited, because a width d301, in the substrate scanning direction (x axis direction), of each of the openings 300A of the restriction board 300 is set sufficiently wide.

According to the present embodiment, the restriction board 300 thus prevents vapor deposition particles, which otherwise enter the openings 82 with a large incident angle (technically, an incident angle as viewed from a direction perpendicular to the orthogonal-to-scan direction), from entering the openings 82. It is therefore possible to adjust the width B (see FIG. 23) of the inclined side surface 23s of the vapor-deposited film (that is, a luminescent layer 23R, 23G or 23B), by adjusting (i) a width d301a of each of the openings 300A of the restriction board 300, (ii) the thickness d300 of the restriction board 300 and/or (iii) the gap g3 between the vapor deposition source 85 and the restriction board 300. Specifically, the width B of the inclined side surface 23s increases when (i) the width d301a is increased, (ii) the thickness d300 is reduced or (iii) the gap g3 is reduced. On the other hand, the width B of the inclined side surface 23s decreases when (i) the width d301a is reduced, (ii) the thickness d300 is increased or (iii) the gap g3 is increased.

According to the present embodiment, it is thus possible to easily form the vapor-deposited film 211 so that the vapor-deposited film 211 has gently inclined side surfaces 23s, by adjusting (i) the width d301a of each of the openings 300A of the restriction board 300, (ii) the gap g3 between the restriction board 300 and the vapor deposition source 85 and/or (iii) the thickness d300 of the restriction board 300.

Note that the present embodiment has dealt with a case where the vapor deposition method and the vapor deposition device of the present invention are used to form the luminescent layers 23R, 23G, and 23B. The vapor deposition method and the vapor deposition device of the present invention can also be used to form, for example, first electrodes 21, a second electrode 26, a hole injection and transfer layer 22, an electron transfer layer 24, an electron injection layer 25, a hole injection layer 27, and hole transfer layers 28R, 28G and 28B.

(Summary)

It is preferable to configure the film formation substrate of Embodiments of present invention such that a width, in the predetermined direction, of a part of the each of the vapor-deposited films, which part is other than the inclined side surfaces, is not smaller than the width, in the predetermined direction, of the corresponding one of the plurality of vapor deposition regions.

According to the configuration, the width, in the predetermined direction, of the part of the each of the vapor-deposited films which part is other than the inclined side surfaces (that is, a flat part of the each of the vapor-deposited films) is not smaller than the width, in the predetermined direction, of the corresponding one of the plurality of vapor deposition regions. Therefore, the width, in the predetermined direction, of the part of the each of the vapor-deposited films which part is other than the inclined side surfaces can be so large that a full-thickness part of the each of the vapor-deposited films can entirely covers the width, in the predetermined direction, of the corresponding one of the plurality of vapor deposition regions.

It is preferable to configure the film formation substrate of Embodiments of present invention such that a width, in the predetermined direction, of each of the inclined side surfaces is not larger than the width, in the predetermined direction, of the region between the corresponding one of the plurality of vapor deposition regions and the adjacent one of the plurality of vapor deposition regions.

According to the configuration, the width, in the predetermined direction, of each of the inclined side surfaces is not larger than the width, in the predetermined direction, of the region between the corresponding one of the plurality of vapor deposition regions and the adjacent one of the plurality of vapor deposition regions. Therefore, even in a case where a vapor-deposited film is displaced relative to the film formation substrate, it is possible to prevent an inclined side surface of the vapor-deposited film from overlapping its adjacent vapor deposition film.

It is preferable to configure the film formation substrate of Embodiments of present invention such that a maximum displacement, in the predetermined direction, between a center of the width, in the predetermined direction, of the each of the vapor-deposited films and a center of the width, in the predetermined direction, of the corresponding one of the plurality of vapor deposition regions is not smaller than half of the width, in the predetermined direction, of the region between the corresponding one of the plurality of vapor deposition regions and the adjacent one of the plurality of vapor deposition regions.

According to the configuration, the maximum displacement, in the predetermined direction, between the center of the width, in the predetermined direction, of the each of the vapor-deposited films and the center of the width, in the predetermined direction, of the corresponding one of the plurality of vapor deposition regions is not smaller than half of the width, in the predetermined direction, of the region between the corresponding one of the plurality of vapor deposition regions and the adjacent one of the plurality of vapor deposition regions. Even in this case, it is possible to (i) prevent a vapor-deposited film from becoming absent in a corresponding vapor deposition region, and prevent a short circuit from being caused and (ii) reduce a degree of color mixture.

It is preferable to configure the film formation substrate of Embodiments of present invention such that a gradient H/B of each of the inclined side surfaces is not more than 1/200, where (i) B is a width, in the predetermined direction, of the each of the inclined side surfaces and (ii) H is a maximum thickness of a/the part of the each of the vapor-deposited films which part is other than the inclined side surfaces.

According to the configuration, the gradient H/B of each of the inclined side surfaces is not more than 1/200. Therefore, in a case where the inclined side surfaces are flat, it is possible to effectively reduce color mixture caused by overlapping of one of the inclined side surfaces of the vapor-deposited film with its adjacent vapor deposition region.

It is preferable to configure the film formation substrate of Embodiments of present invention such that each of the inclined side surfaces inclines (i) most steeply in a middle, in the predetermined direction, of the each of the inclined side surfaces and (ii) more gently in opposite end parts, along the predetermined direction, of the each of the inclined side surfaces than in the middle.

According to the configuration, each of the inclined side surfaces inclines (i) most steeply in the middle, in the predetermined direction, of the each of the inclined side surfaces and (ii) more gently on the opposite sides, along the predetermined direction, of the each of the inclined side surfaces than in the middle. Therefore, the thickness of part of a vapor-deposited film, which part is a starting end, in the predetermined direction, of each inclined side surface of the vapor-deposited film (that is, an end closer to a flat part of the vapor-deposited film), is not so small. On the other hand, the thickness of part of the vapor-deposited film, which part is an ending end, in the predetermined direction, of the each inclined side surface of the vapor-deposited film smaller (that is, an end away from the flat part of the vapor-deposited film). Therefore, in a case where the starting end overlaps a corresponding vapor deposition region, it is possible to suppress reduction in thickness of the vapor-deposited film in the starting end. In a case where the ending part overlaps its adjacent vapor deposition region, color mixture can be further reduced in the ending end.

It is preferable to configure the film formation substrate of Embodiments of present invention such that a gradient H/B of the each of the inclined side surfaces is not more than $(\pi/2)\times 1/200$, where (i) B is a/the width, in the predetermined direction, of the each of the inclined side surfaces and (ii) H is a/the maximum thickness of a/the part of the each of the vapor-deposited films which part is other than the inclined side surfaces.

According to the configuration, the gradient H/B of the each of the inclined side surfaces is not more than $(\pi/2)\times 1/200$, where (i) B is a/the width, in the predetermined direction, of the each of the inclined side surfaces and (ii) H is a/the maximum thickness of a/the part of the each of the vapor-deposited films which part is other than the inclined side surfaces. Therefore, in a case where the inclined side surfaces are curved, it is possible to effectively reduce color mixture caused by overlapping of one of the inclined side surfaces of the vapor-deposited film with its adjacent vapor deposition region.

It is preferable to configure the film formation substrate of Embodiments of present invention such that a gradient of the each of the inclined side surfaces is represented by a cosine function.

According to the configuration, the gradient of the each of the inclined side surfaces is represented by the cosine function. Therefore, a conventionally well-known function can be used so as to represent the gradient of the each of the inclined side surfaces.

It is preferable to configure the film formation substrate of Embodiments of present invention such that H(x) is represented by Expression 1:

$$H(x) = \frac{H_0}{2}\left\{\cos\left(\frac{\pi}{B}x\right) + 1\right\}$$

where (i) $H_0$ is a maximum thickness of a/the part of the each of the vapor-deposited films which part is other than the inclined side surfaces, (ii) B is a/the width, in the predetermined direction, of the each of the inclined side surfaces and (iii) H(x) is a thickness of the each of the vapor-deposited films which thickness is measured at a position away from one end of the each of the inclined side surfaces toward the other end of the each of the inclined side surfaces by x along the predetermined direction, which one end is in contact with the part of the each of the vapor-deposited films.

According to the configuration, the gradient of the each of the inclined side surfaces is represented by a substantial cosine function. Therefore, a conventionally well-known function can be used so as to represent the gradient of the each of the inclined side surfaces.

It is preferable to configure the film formation substrate of Embodiments of present invention such that one of the inclined side surfaces of at least one of the vapor-deposited films overlaps a vapor deposition region that is adjacent to a vapor deposition region where the at least one of the vapor-deposited films is provided.

According to the configuration, one of inclined side surfaces of a vapor-deposited film overlaps a vapor deposition region that is adjacent to a vapor deposition region where the vapor-deposited film is provided, as a result of displacement of the vapor-deposited film along the predetermined direction relative to the film formation substrate. However, a degree of color mixture is reduced thanks to the inclined side surfaces.

It is preferable to configure the film formation substrate of Embodiments of present invention such that each of the vapor-deposited films entirely covers a corresponding one of the plurality of vapor deposition regions.

According to the configuration, each of the vapor-deposited films entirely covers a corresponding one of the plurality of vapor deposition regions. It is therefore possible to prevent a vapor-deposited film from becoming absent in a corresponding vapor deposition region and prevent a short circuit from being caused.

It is preferable to configure an organic EL display device of Embodiments of the present invention so as to be an organic EL display device including any one of the film formation substrates, the film formation substrate having at least first electrodes, an organic layer including a luminescent layer, and a second electrode thereon in this order, at least a layer of the organic layer being constituted by the vapor-deposited films.

According to the configuration, it is possible to attain an organic EL display device which brings about an effect of the film formation substrate for at least the layer of the organic layer.

INDUSTRIAL APPLICABILITY

A vapor deposition device and a vapor deposition method of the present invention are suitably applicable to, for example, a device and method for producing an organic EL display device which are used in a process of, for example, selective application formation of an organic layer in the organic EL display device. The vapor deposition device and the vapor deposition method of the present invention are also applicable to production of a film formation substrate in which a displacement of a patterned film would affect surrounding regions.

REFERENCE SIGNS LIST

1: Organic EL display device
2: Pixel
2R, 2G, and 2B: sub-pixel
10: TFT substrate (film formation substrate)
20: Organic EL element
23R, 23G, and 23B: Luminescent layer (organic layer, vapor-deposited film)
23s: Inclined side surface
23t: Flat part
80: Mask unit
81: Shadow mask (vapor deposition mask)
86: Injection hole
86x: Nozzle opening length
86y: Nozzle opening width
210: Display region
210s: Region where incident angle is restricted
210s1 and 210s2: End part of region 210s
211: Vapor-deposited film
H: Thickness of flat part
B: Width of inclined side surface
$N_A$ and $N_B$: Effective region
x: Direction along substrate scanning direction
y: Direction along direction orthogonal to substrate scanning direction (predetermined direction)

The invention claimed is:

1. A film formation substrate comprising a plurality of vapor deposition regions (i) which are arranged along a predetermined direction and (ii) in which respective vapor-deposited films are provided, each of the vapor-deposited films having inclined side surfaces in opposite parts, along the predetermined direction, of the each of the vapor-deposited films, the inclined side surfaces being inclined with respect to a direction normal to the film formation substrate, and a width, in the predetermined direction, of the each of the vapor-deposited films is larger than the sum of (i) a width, in the predetermined direction, of a corresponding one of the plurality of vapor deposition regions and (ii) a width, in the predetermined direction, of a region between the corresponding one of the plurality of vapor deposition regions and an adjacent one of the plurality of vapor deposition regions which is adjacent to the corresponding one of the plurality of vapor deposition regions.

2. The film formation substrate as set forth in claim 1, wherein a width, in the predetermined direction, of a part of the each of the vapor-deposited films which part is other than the inclined side surfaces is not smaller than the width, in the predetermined direction, of the corresponding one of the plurality of vapor deposition regions.

3. The film formation substrate as set forth in claim 1, wherein a width, in the predetermined direction, of each of the inclined side surfaces is not larger than the width, in the predetermined direction, of the region between the corresponding one of the plurality of vapor deposition regions and the adjacent one of the plurality of vapor deposition regions.

4. The film formation substrate as set forth in claim 1, wherein a maximum displacement, in the predetermined direction, between a center of the width, in the predetermined direction, of the each of the vapor-deposited films and a center of the width, in the predetermined direction, of the corresponding one of the plurality of vapor deposition regions is not smaller than half of the width, in the predetermined direction, of the region between the corresponding one of the plurality of vapor deposition regions and the adjacent one of the plurality of vapor deposition regions.

5. The film formation substrate as set forth in claim 1, wherein a gradient H/B of each of the inclined side surfaces is not more than $1/200$, where (i) B is a width, in the predetermined direction, of the each of the inclined side surfaces and (ii) H is a maximum thickness of a/the part of the each of the vapor-deposited films which part is other than the inclined side surfaces.

6. The film formation substrate as set forth in claim 1, wherein each of the inclined side surfaces inclines (i) most steeply in a middle, in the predetermined direction, of the each of the inclined side surfaces and (ii) more gently in opposite end parts, along the predetermined direction, of the each of the inclined side surfaces than in the middle.

7. The film formation substrate as set forth in claim 6, wherein a gradient H/B of the each of the inclined side surfaces is not more than $(\pi/2) \times 1/200$, where (i) B is a/the width, in the predetermined direction, of the each of the inclined side surfaces and (ii) H is a/the maximum thickness of a/the part of the each of the vapor-deposited films which part is other than the inclined side surfaces.

8. The film formation substrate as set forth in claim 6, wherein a gradient of the each of the inclined side surfaces is represented by a cosine function.

9. The film formation substrate as set forth in claim 8, wherein H(x) is represented by Expression 1:

$$H(x) = \frac{H_0}{2}\left\{\cos\left(\frac{\pi}{B}x\right) + 1\right\}$$

where (i) $H_0$ is a maximum thickness of a/the part of the each of the vapor-deposited films which part is other than the inclined side surfaces, (ii) B is a/the width, in the predetermined direction, of the each of the inclined side surfaces and (iii) H(x) is a thickness of the each of the vapor-deposited films which thickness is measured at a position away from one end of the each of the inclined side surfaces toward the other end of the each of the inclined side surfaces by x along the predetermined direction, which one end is in contact with the part of the each of the vapor-deposited films.

10. The film formation substrate as set forth in claim 1, wherein one of the inclined side surfaces of at least one of the vapor-deposited films overlaps a vapor deposition region that is adjacent to a vapor deposition region where the at least one of the vapor-deposited films is provided.

11. The film formation substrate as set forth in claim 1, wherein each of the vapor-deposited films entirely covers a corresponding one of the plurality of vapor deposition regions.

12. An organic EL display device comprising a film formation substrate as set forth in claim 1,
the film formation substrate having at least first electrodes, an organic layer including a luminescent layer, and a second electrode thereon in this order,
at least a layer of the organic layer being constituted by the vapor-deposited films.

13. A vapor deposition method for forming vapor-deposited films in a respective plurality of vapor deposition regions of a film formation substrate, which vapor deposition regions are arranged along a predetermined direction,
the vapor deposition method comprising the steps of:
(a) preparing a mask unit which includes (i) a vapor deposition mask that has openings corresponding to the respective plurality of vapor deposition regions and (ii) a vapor deposition source provided so as to face the vapor deposition mask;
(b) positioning the vapor deposition mask and the film formation substrate relative to each other with respect to the predetermined direction; and
(c) forming the vapor-deposited films in the respective plurality of vapor deposition regions by depositing vapor deposition particles on the film formation substrate via the openings, the vapor deposition particles being injected from the vapor deposition source,
in the step (c), the vapor-deposited films being formed so that (i) each of the vapor-deposited films covers a corresponding one of the respective plurality of vapor deposition regions, (ii) each of the vapor-deposited films has inclined side surfaces in opposite parts, along the predetermined direction, of the each of the vapor-deposited films, the inclined side surfaces being inclined with respect to a direction normal to the film formation substrate and (iii) a width, in the predetermined direction, of the each of the vapor-deposited films is larger than the sum of a width, in the predetermined direction, of the corresponding one of the plurality of vapor deposition regions and a width, in the predetermined direction, of a region between the corresponding one of the plurality of vapor deposition regions and adjacent one of the plurality of vapor deposition regions which is adjacent to the corresponding one of the plurality of vapor deposition regions.

* * * * *